US012191429B2

(12) United States Patent
Yoshida

(10) Patent No.: US 12,191,429 B2
(45) Date of Patent: Jan. 7, 2025

(54) LIGHT EMITTING DEVICE

(71) Applicant: NICHIA CORPORATION, Anan (JP)

(72) Inventor: Norimasa Yoshida, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 522 days.

(21) Appl. No.: 17/706,092

(22) Filed: Mar. 28, 2022

(65) Prior Publication Data

US 2022/0328739 A1 Oct. 13, 2022

(30) Foreign Application Priority Data

Apr. 8, 2021 (JP) .................................. 2021-065969
Nov. 12, 2021 (JP) .................................. 2021-185194

(51) Int. Cl.
*H01L 33/58* (2010.01)
*H01L 33/50* (2010.01)

(52) U.S. Cl.
CPC ............ *H01L 33/58* (2013.01); *H01L 33/502* (2013.01)

(58) Field of Classification Search
CPC ............................... H01L 33/502; H01L 33/58
USPC ......................................................... 362/285
See application file for complete search history.

(56) References Cited

U.S. PATENT DOCUMENTS

| 4,444,478 | A | 4/1984 | Keith et al. | |
|---|---|---|---|---|
| 7,874,701 | B2 * | 1/2011 | Pohlert | G03B 15/03 362/244 |
| 2010/0254115 | A1 | 10/2010 | Wegh et al. | |
| 2014/0055661 | A1 | 2/2014 | Imamura et al. | |
| 2014/0218893 | A1 | 8/2014 | Tamura et al. | |
| 2017/0196060 | A1 | 7/2017 | Watanabe et al. | |
| 2018/0066809 | A1 | 3/2018 | Vdovin et al. | |
| 2019/0280174 | A1 * | 9/2019 | Okahisa | H01L 27/156 |
| 2020/0073207 | A1 * | 3/2020 | Okahisa | G03B 15/02 |
| 2020/0098735 | A1 * | 3/2020 | Tada | F21V 3/0615 |
| 2020/0098944 | A1 * | 3/2020 | Bory | H01L 33/60 |
| 2020/0248890 | A1 * | 8/2020 | Osaka | G02B 19/0014 |
| 2020/0343422 | A1 * | 10/2020 | Yamamoto | H01L 33/54 |
| 2021/0151647 | A1 * | 5/2021 | Pfeffer | F21S 41/40 |
| 2022/0333751 | A1 * | 10/2022 | Yoshida | F21V 17/02 |

FOREIGN PATENT DOCUMENTS

| JP | S59-102218 | A | 6/1984 |
|---|---|---|---|
| JP | H01-010796 | A | 1/1989 |
| JP | 2003-098426 | A | 4/2003 |
| JP | 2004-349647 | A | 12/2004 |
| JP | 2008-227042 | A | 9/2008 |
| JP | 2009-020298 | A | 1/2009 |
| JP | 2010-529610 | A | 8/2010 |
| JP | 2011-119390 | A | 6/2011 |

(Continued)

*Primary Examiner* — Christopher M Raabe
(74) *Attorney, Agent, or Firm* — Foley & Lardner LLP

(57) ABSTRACT

A light emitting device includes: a light emitting unit; an optical member configured to transmit or pass light emitted by the light emitting unit, the optical member including: a first region configured to transmit or pass light having a first chromaticity; and a second region configured to transmit or pass light having a second chromaticity different from the first chromaticity; and a movable member configured to move to change a distance between the light emitting unit and the optical member along an optical axis of the light emitting unit.

16 Claims, 19 Drawing Sheets

(56) References Cited

FOREIGN PATENT DOCUMENTS

| | | |
|---|---|---|
| JP | 2012-009155 A | 1/2012 |
| JP | 2012-022308 A | 2/2012 |
| JP | 2012-221634 A | 11/2012 |
| JP | 2013-084470 A | 5/2013 |
| JP | 2016-028370 A | 2/2016 |
| JP | 2017-120897 A | 7/2017 |
| JP | 2018-511910 A | 4/2018 |
| WO | WO-2013/114891 A1 | 8/2013 |
| WO | WO-2014/073237 A1 | 5/2014 |
| WO | WO-2016/021675 A1 | 2/2016 |

\* cited by examiner

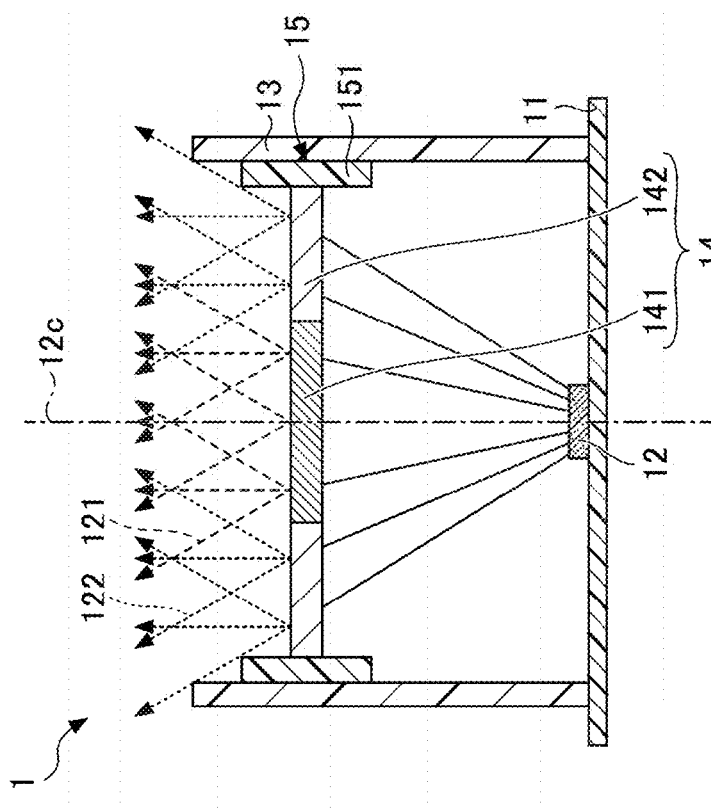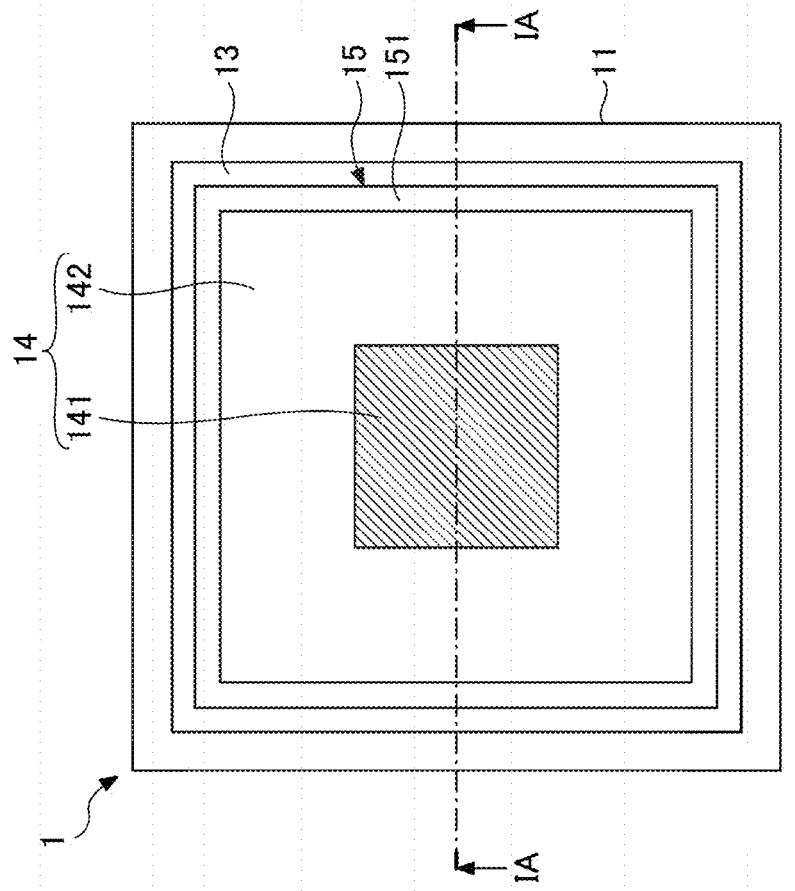

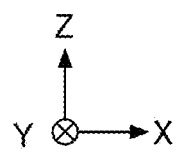
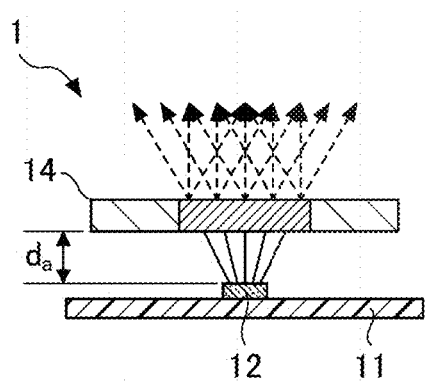
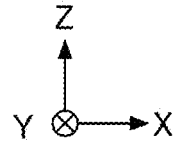
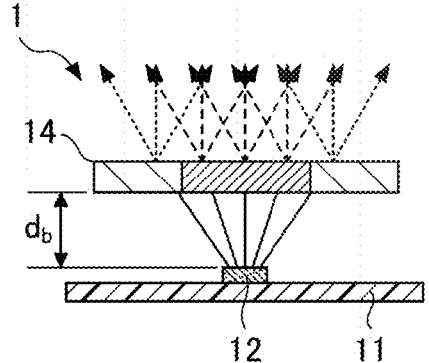
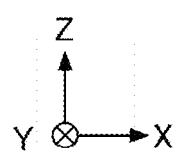
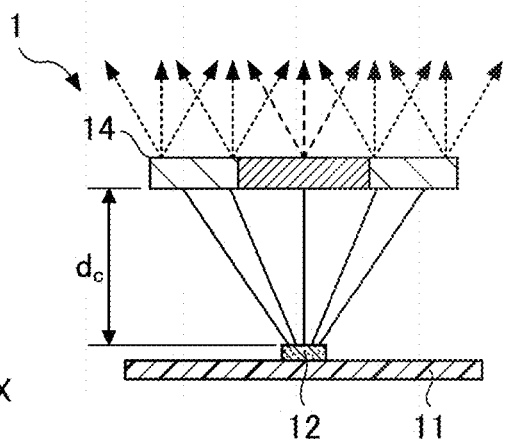

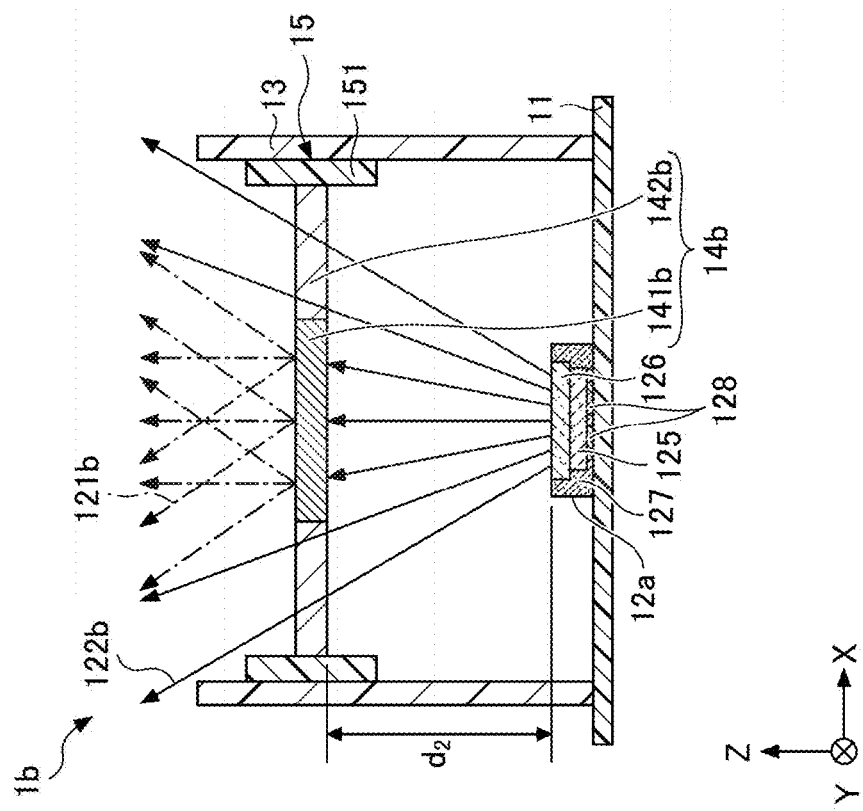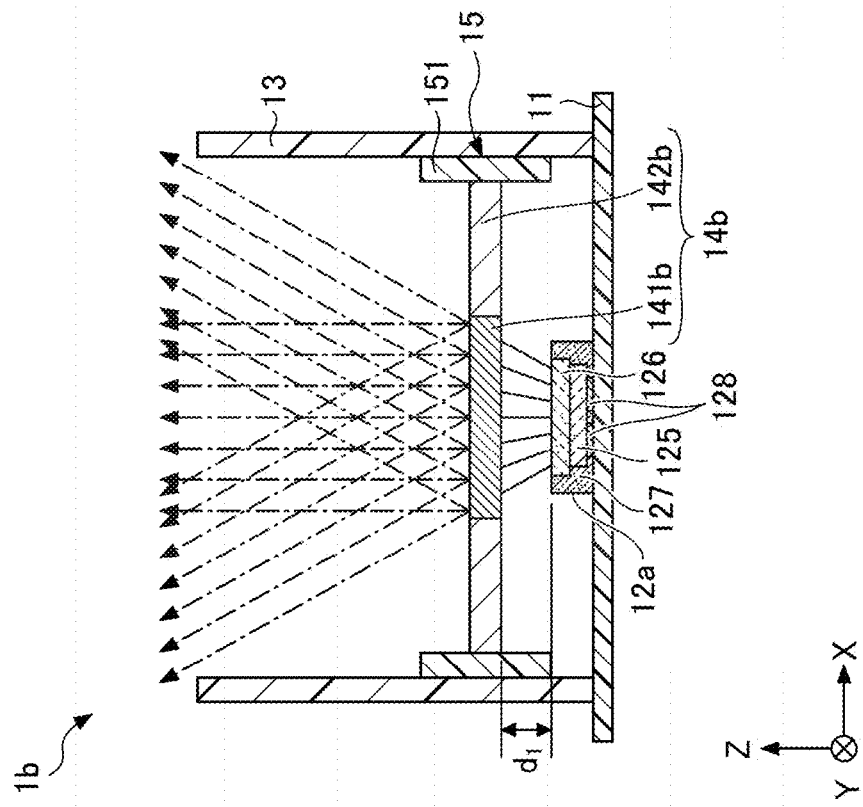

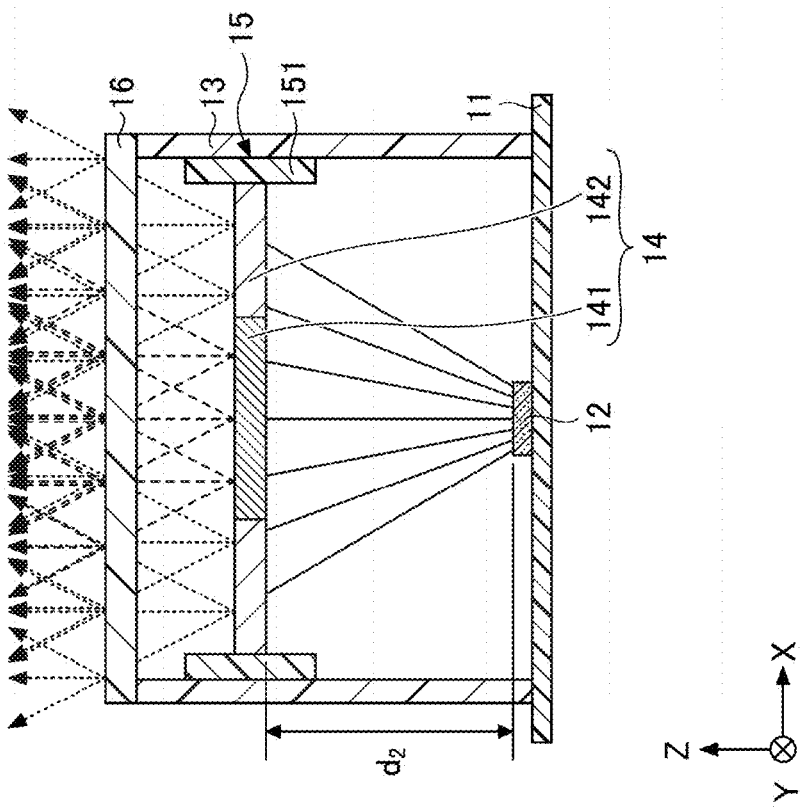
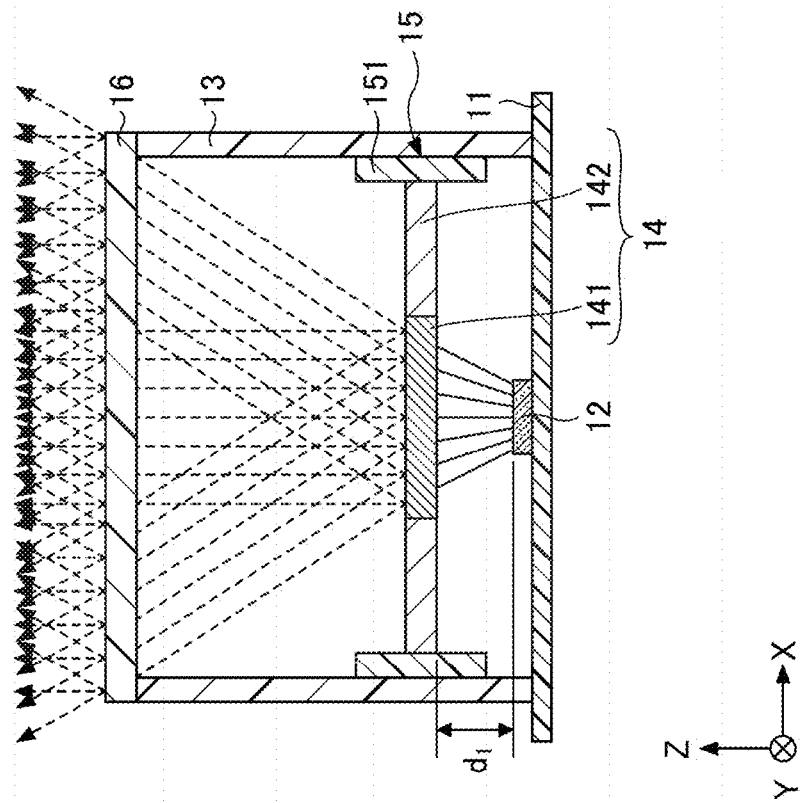

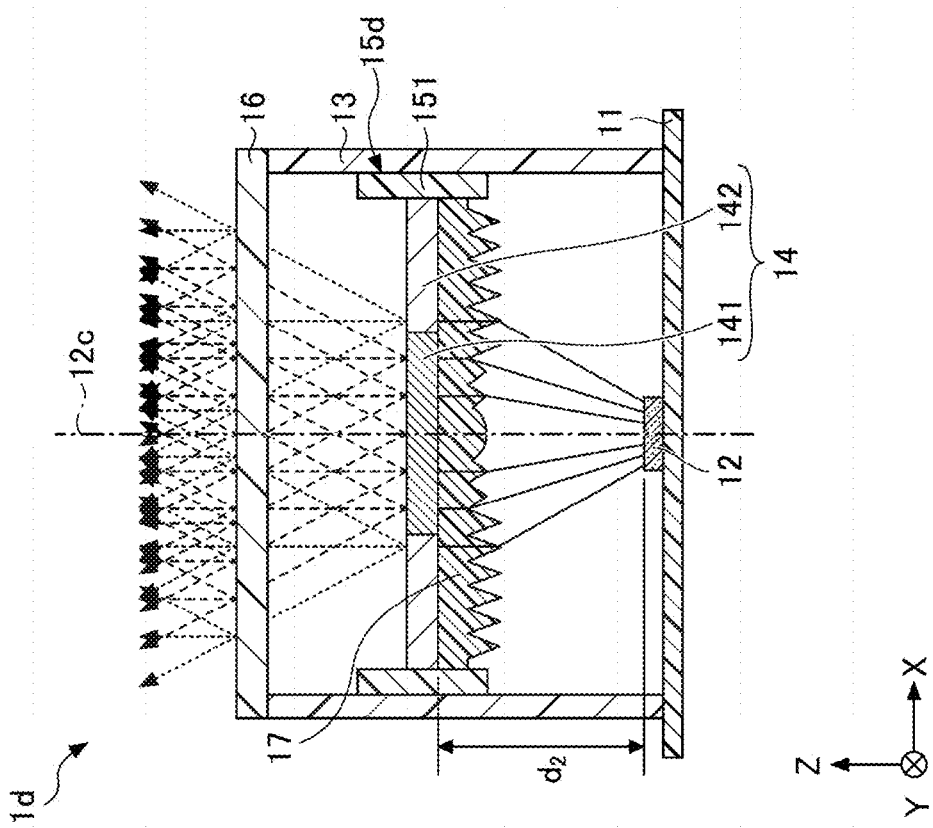
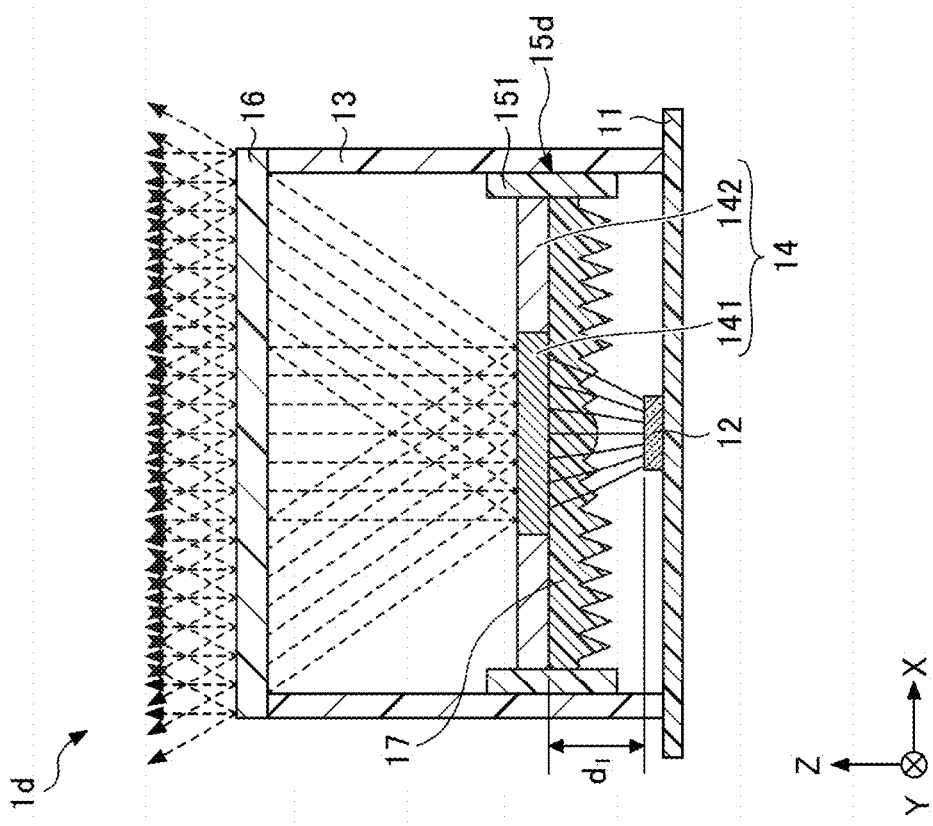

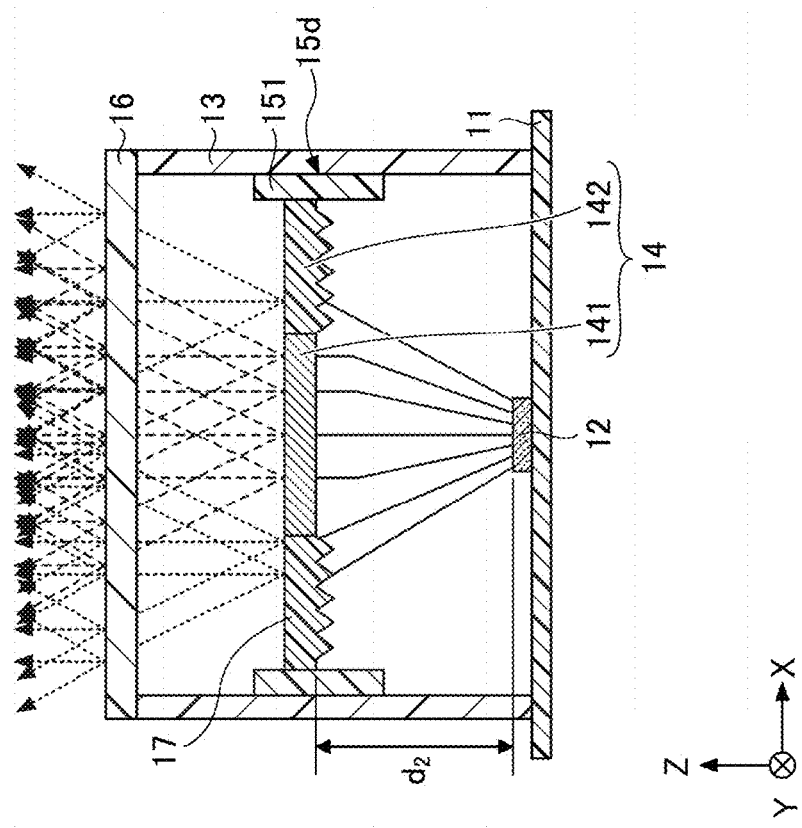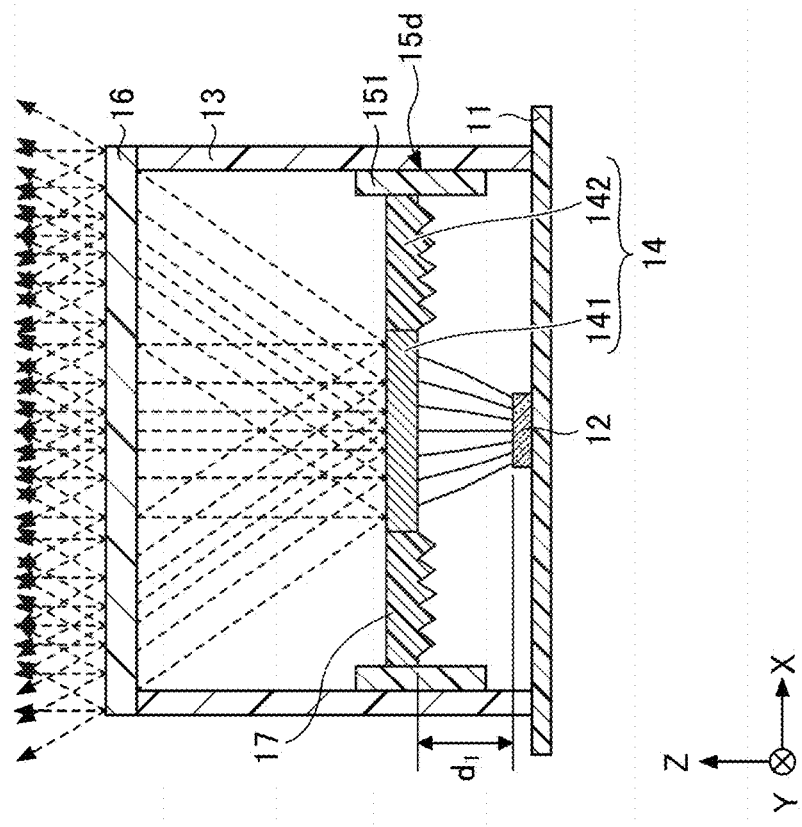

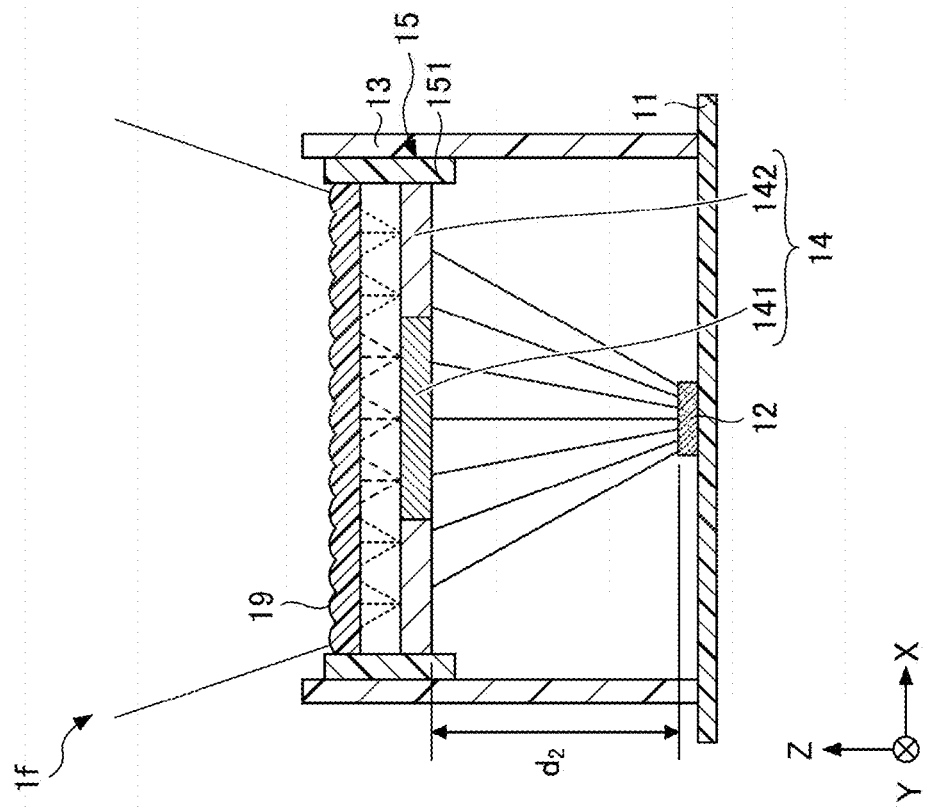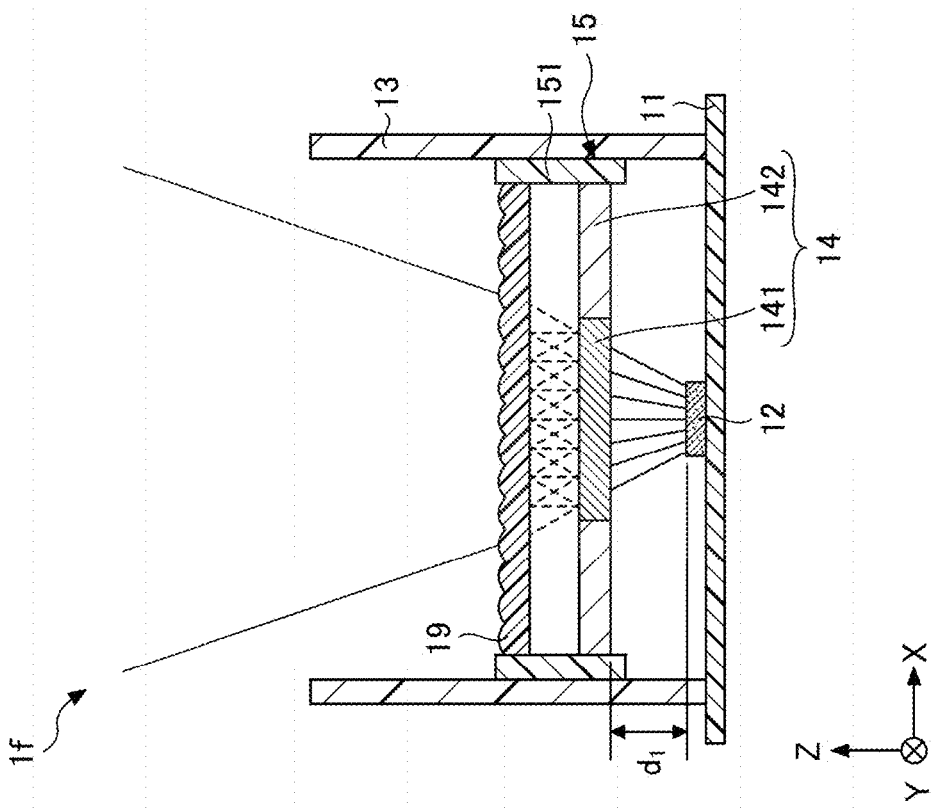

LIGHT EMITTING DEVICE

CROSS-REFERENCE TO RELATED APPLICATION

This application claims priority to Japanese Patent Application No. 2021-065969, filed on Apr. 8, 2021, and Japanese Patent Application No. 2021-185194, filed on Nov. 12, 2021, the disclosures of which are hereby incorporated by reference in their entireties.

BACKGROUND

The present disclosure relates to a light emitting device.

There are known light emitting devices configured to emit light from a light emitting element upon wavelength conversion by a wavelength conversion member such as phosphor.

Further, configurations have been disclosed in which a thickness of a sealing resin directly above a plurality of sets of light emitting elements differs for the respective sets, thereby making a chromaticity of light emitted from the sealing resin differ when each of the plurality of sets of light emitting elements emits the light alone as a single set (refer to Japanese Patent Publication No. 2017-120897, for example).

SUMMARY

Nevertheless, in the configuration of the above Patent Publication, each of the plurality of sets of light emitting elements is caused to emit light on a per set basis, resulting in a low degree of freedom in color adjustment of the light emitting device.

An object of the present disclosure is to provide a light emitting device having a high degree of freedom in color adjustment of light.

A light emitting device according to an embodiment of the present disclosure includes a light emitting unit, an optical member configured to transmit or pass light emitted by the light emitting unit, and a movable member. The optical member includes a first region configured to transmit or pass light having a first chromaticity. The optical member further includes a second region configured to transmit or pass light having a second chromaticity different from the first chromaticity. The movable member is configured to move to change a distance between the light emitting unit and the optical member along an optical axis of the light emitting unit.

A light emitting device according to an embodiment of the present disclosure includes a light emitting unit, an optical member configured to transmit or pass light emitted by the light emitting unit, a light emission side light distribution member, and a movable member. The optical member includes a first region configured to transmit or pass light having a first chromaticity. The optical member further includes a second region configured to transmit or pass light having a second chromaticity different from the first chromaticity. A light emission side light distribution member is disposed between the light emitting unit and the optical member, and is configured to define a distribution of light from the light emitting unit. The movable member is configured to move to change a distance between the light emitting unit and the light emission side light distribution member in a direction along an optical axis of the light emitting unit.

According to an embodiment of the present disclosure, a light emitting device having a high degree of freedom in color adjustment of light can be provided.

BRIEF DESCRIPTION OF DRAWINGS

FIGS. 1A and 1B are schematic diagrams illustrating a configuration example of a light emitting device according to a first embodiment, FIG. 1A being a top view, and FIG. 1B being a cross-sectional view along cutting line IA-IA in FIG. 1A.

FIGS. 5A to 5D are diagrams illustrating a chromaticity change example of the light emitting device according to the first embodiment, FIGS. 5A to 5C being schematic diagrams illustrating states of the light emitting device, and FIG. 5D being an xy chromaticity diagram.

FIGS. 7A and 7B are cross-sectional views illustrating a configuration example of a light emitting device according to a second modified example of the first embodiment, FIG. 7A being a view before a color change, and FIG. 7B being a view after a color change.

FIGS. 8A and 8B are cross-sectional views illustrating a configuration example of a light emitting device according to a third modified example of the first embodiment, FIG. 8A being a view before a color change, and FIG. 8B being a view after a color change.

FIGS. 9A and 9B are cross-sectional views illustrating a configuration example of a light emitting device according to a second embodiment, FIG. 9A being a view before a color change, and FIG. 9B being a view after a color change.

FIGS. 10A and 10B are cross-sectional views illustrating a configuration example of a light emitting device according to a modified example of the second embodiment, FIG. 10A being a view before a color change, and FIG. 10B being a view after a color change.

FIGS. 13A and 13B are cross-sectional views illustrating a configuration example of a light emitting device according to a modified example of the third embodiment, FIG. 13A being a view before a color change, and FIG. 13B being a view after a color change.

DETAILED DESCRIPTION

Figure 2A:
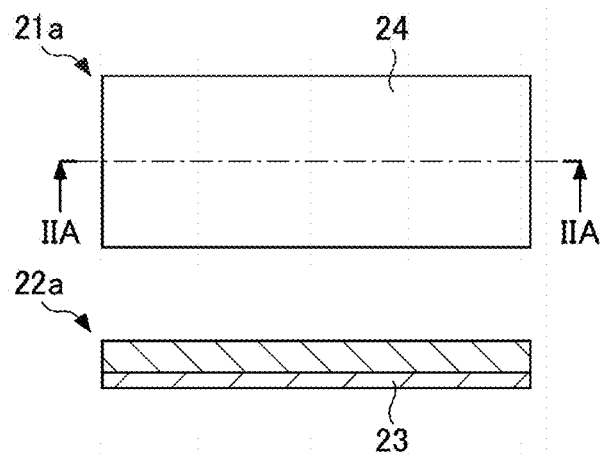
FIGS. 2A to 2F are schematic diagrams illustrating an example of a method for producing a wavelength conversion plate that is an optical member in the light emitting device according to the first embodiment, FIG. 2A to FIG. 2F being schematic diagrams illustrating each production step.

Hereinafter, embodiments for carrying out the invention will be described with reference to the drawings. Note that, hereinafter, parts having the same reference numerals appearing in a plurality of drawings indicate identical or equivalent parts or members. In a cross-sectional view, an end surface view illustrating only a cut surface may be used.

Further, while the embodiments described below are examples of light emitting devices embodying the technical concepts of the present invention, the present invention is not limited to the described embodiments. Unless otherwise specified, the dimensions, materials, shapes, relative arrangements, and the like of constituent elements described below are not intended to limit the scope of the present invention to those alone, but are intended to be illustrative. The size, positional relationship, and the like of the members illustrated in the drawings can be exaggerated in order to clarify explanation.

In the drawings described below, directions may be indicated by an X axis, a Y axis, and a Z axis. An X direction along the X axis indicates a predetermined direction in a plane including at least a first region provided with a light emitting device according to the embodiment, a Y direction along the Y axis indicates a direction orthogonal to the X direction in the plane described above, and a Z direction along the Z axis indicates a direction orthogonal to the plane described above.

Also, the direction in the X direction in which the arrow faces is the +X direction and the opposite direction to the +X direction is the −X direction, the direction in the Y direction in which the arrow faces is the +Y direction and the opposite direction to the +Y direction is the −Y direction, and the direction in the Z direction in which the arrow faces is the +Z direction and the opposite direction to the +Z direction is the −Z direction. In the embodiments, a light emitting unit of the light emitting device irradiates light in the +Z direction as an example. Further, an optical axis of the light emitting unit extends along the Z axis. Along the Z axis in this specification includes the subject having a slope within a range of ±10° relative to the Z axis. However, this does not limit the orientation of the light emitting device during use, and the orientation of the light emitting device may be any desired orientation.

A light emitting device according to the embodiment includes a light emitting unit, an optical member configured to transmit or pass light emitted by the light emitting unit, and a movable member configured to change a distance between the light emitting unit and the optical member. Alternatively, the light emitting device according to an embodiment includes: a light emitting unit; an optical member configured to transmit or pass light emitted by the light emitting unit; a light emission side light distribution member disposed between the light emitting unit and the optical member, and configured to define a distribution of light from the light emitting unit; and a movable member configured to change a distance between the light emitting unit and the light emission side light distribution member. This movable member changes the distance between the light emitting unit and the optical member in a direction along an optical axis of the light emitting unit. Further, this movable member changes the distance between the light emitting unit and the light emission side light distribution member in a direction along the optical axis of the light emitting unit. Such a light emitting device is used in applications such as various lighting or light irradiation.

In an embodiment, the optical member includes a first region in which light having a first chromaticity is allowed to be extracted and a second region in which light having a second chromaticity different from the first chromaticity is allowed to be extracted, and is allowed to extract, of the light emitted by the light emitting unit, mixed light formed by light being transmitted or passed through each of the first region and the second region and then being mixed. Further, in an embodiment, the distance between the light emitting unit and the optical member, or the distance between the light emitting unit and the light emission side light distribution member is changed in a direction along the optical axis of the light emitting unit by the movable member. Thus, a light emitting device that can change the chromaticity of mixed light and has a high degree of freedom in color adjustment of light is provided. Here, the term "color adjustment" refers to adjustment of the color of light.

Embodiments will be described below in detail.

First Embodiment

Configuration Example of Light Emitting Device 1

FIGS. 1A and 1B are schematic diagrams illustrating an example of a configuration of a light emitting device 1 according to a first embodiment. FIG. 1A is a top view, and FIG. 1B is a cross-sectional view along cutting line IA-IA in FIG. 1A.

As illustrated in FIGS. 1A and 1B, the light emitting device 1 includes a light emitting unit mounting substrate 11, a light emitting element 12, a support 13, a wavelength conversion plate 14, and an actuator 15.

The light emitting unit mounting substrate 11 is a plate-shaped member having a substantially rectangular shape in a plan view, and is a substrate provided with wirings to which light emitting elements and various electrical elements can be mounted. A substrate of various materials such as a metal substrate, a paper phenol substrate, a paper epoxy substrate, or a glass epoxy substrate can be applied to the light emitting unit mounting substrate 11.

The light emitting element 12 is mounted on a surface of the light emitting unit mounting substrate 11 on the +Z direction side, and is an example of a light emitting unit that emits light. The light emitting element 12 is a semiconductor element that emits light by itself when voltage is applied. The light emitting element 12 includes at least a semiconductor layered body and is provided with at least a pair of electrodes having different polarities, for example, a p-side electrode and an n-side electrode.

As the material of the semiconductor, preferably a nitride semiconductor is used. This material can emit short wavelength light which can efficiently excite a wavelength conversion substance such as phosphor included in the wavelength conversion member. The nitride semiconductor is mainly represented by the general formula $In_xAl_yGa_{1-x-y}N$ ($0 \leq x$, $0 \leq y$, $x+y \leq 1$). An emission peak wavelength of the light emitting element 12 is preferably in a range from 400 nm to 530 nm, more preferably in a range from 420 nm to 490 nm, and even more preferably in a range from 450 nm to 475 nm from the viewpoints of light emission efficiency, excitation of the wavelength conversion substance, a color mixing relationship with the light emission thereof, and the like. Further, as the material of the semiconductor, an InAlGaAs semiconductor, an InAlGaP semiconductor or the like can be used. As an example in the present disclosure, a light emitting device employing a light emitting element that emits blue light will be described as the light emitting element 12.

Note that the light emitting unit of the light emitting device 1 is not limited to the light emitting element 12, and various types of light sources can be used, such as a xenon lamp or a light emitting device (LED) in which the light emitting element 12 is inserted in a package. However, in order to efficiently excite the wavelength conversion substance contained in the wavelength conversion member, a light emitting element that emits light of a short wavelength is preferable.

The support 13 is a cylindrical member having a cross section orthogonal to the Z axis that is substantially rectangular. A central axis of the cylinder is along the Z axis. The support 13 is provided on a surface of the light emitting unit mounting substrate 11 on the +Z direction side so that the light emitting element 12 is disposed inside the cylinder.

A material of the support 13 is not particularly limited, and a metal material, a resin material, or the like can be selected as appropriate according to the application of the light emitting device 1.

The wavelength conversion plate 14 is an example of an optical member including a first region 141 in which light having a first chromaticity can be extracted and a second region 142 in which light having a second chromaticity different from the first chromaticity can be extracted, and is configured to transmit light emitted by the light emitting element 12.

The first region 141 is provided substantially in a center of the wavelength conversion plate 14 formed into a plate shape, and is formed into a substantially rectangular shape in a plan view. The first region 141 includes a wavelength conversion member that converts light emitted by the light emitting element 12 into light of a first wavelength. In the first region 141, the light of the first wavelength converted by the wavelength conversion member can be extracted as the light having the first chromaticity. In FIG. 1B, the light emitted by the light emitting element 12 is indicated by a solid line, and light 121 having the first chromaticity is indicated by a dashed line.

The second region 142 is a region around the first region 141 of the wavelength conversion plate 14, surrounding the first region 141, and has an outer shape that is substantially rectangular in a plan view. The second region 142 includes a wavelength conversion member that converts the light emitted by the light emitting element 12 into light of a second wavelength. In the second region 142, the light of the second wavelength converted by the wavelength conversion member can be extracted as the light having the second chromaticity. In FIG. 1B, light 122 having the second chromaticity is indicated by a dotted line.

The wavelength conversion member included in each of the first region 141 and the second region 142 may be a member in which a wavelength conversion substance is contained in a base member such as a resin, for example, silicone, glass, ceramic, or the like, may be a member in which the wavelength conversion substance is printed on a front surface of a molded body such as glass, or may be a sintered body of the wavelength conversion substance. The wavelength conversion substance is a member that absorbs at least a portion of primary light emitted by the light emitting element, and emits secondary light of a wavelength different from that of the primary light.

Examples of the wavelength conversion substance include an yttrium aluminum garnet based phosphor ($Y_3(Al,Ga)_5O_{12}$:Ce, for example), a lutetium aluminum garnet based phosphor ($Lu_3(Al,Ga)_5O_{12}$:Ce, for example), a terbium aluminum garnet based phosphor ($Tb_3(Al,Ga)_5O_{12}$:Ce, for example), a β-SiALON based phosphor (($Si,Al)_3(O,N)_4$:Eu, for example), an a based SiAlON phosphor ($Ca(Si,Al)_{12}(O,N)_{16}$:Eu, for example), a nitride based phosphor such as a CASN based phosphor ($CaAlSiN_3$:Eu, for example) or an SCASN based phosphor (($Sr,Ca)AlSiN_3$:Eu, for example), a fluoride based phosphor such as a KSF based phosphor ($K_2SiF_6$:Mn, for example), a KSAF based phosphor ($K_2(Si,Al)F_6$:Mn, for example), or an MGF based phosphor ($3.5MgO.0.5\ MgF_2GeO_2$:Mn, for example), a phosphor having a perovskite structure ($CsPb(F,Cl,Br,I)_3$, for example), and a quantum dot phosphor (CdSe, InP, $AgInS_2$, or $AgInSe_2$, for example). The phosphor described above is a particle. Further, one type of these wavelength conversion substances can be used alone, or two or more types of these wavelength conversion substances can be used in combination.

The actuator 15 is an example of a movable member that changes the distance between the light emitting element 12 and the wavelength conversion plate 14. The actuator 15 includes a mover 151 that can move along the Z axis, and is provided on the support 13. An optical axis 12c of the light emitting element 12 substantially matches a center of a light emitting surface of the light emitting element 12 and corresponds to an optical axis of the light emitting unit. The actuator 15 can change the distance between the light emitting element 12 and the wavelength conversion plate 14 in a direction along the optical axis 12c of the light emitting element 12.

As the actuator 15, a voice coil motor in which a mover including a coil moves in translation in a magnetic field created by magnets, a supersonic motor that converts natural vibration generated by a metal elastic body into translational movement of a mover by frictional force, or the like can be used.

However, the movable member is not limited to the configuration described above, and may be any appropriate configuration as long as the distance between the light emitting element 12 and the wavelength conversion plate 14 can be changed in the direction along the optical axis 12c of the light emitting element 12. For example, the movable member may have a configuration in which a drive unit, such as a motor, is not provided, and an individual manually changes the distance between the light emitting element 12 and the wavelength conversion plate 14 in the direction along the optical axis 12c of the light emitting element 12, and then fixes the wavelength conversion plate 14.

The mover 151 is formed in a cylindrical shape having a substantially rectangular cross section orthogonal to the Z axis, and the wavelength conversion plate 14 is fixed to an inner surface of the cylinder. The actuator 15, by moving the mover 151 along the Z axis, can move the wavelength conversion plate 14 along the Z axis and change the distance between the light emitting element 12 and the wavelength conversion plate 14.

Note that, as the wavelength conversion plate 14, a plate-shaped member having a substantially rectangular shape in a plan view has been exemplified, but the shape is not limited thereto and may be, for example, a substantially circular shape or a substantially polygonal shape, and need not be plate-shaped, such as sheet-shaped, for example. The first region 141 may also have a substantially circular shape or a substantially polygonal shape or the like in a plan view.

Similarly, as the support 13 and the actuator 15, a cylindrical member having a substantially rectangular cross section orthogonal to the axis of the cylinder has been exemplified, but the cross section is not limited thereto. The cross section may be a substantially circular shape, a substantially polygonal shape, or the like according to the shape of the wavelength conversion plate 14.

Example of Production Method of Wavelength Conversion Plate 14

Here, a production method of the wavelength conversion plate 14 will be described. FIGS. 2A to 2F are diagrams for explaining an example of the production method of the wavelength conversion plate 14 in the light emitting device 1. FIG. 2A to FIG. 2F are schematic diagrams illustrating each production step.

In FIGS. 2A to 2F, 21a to 21f are top views of the wavelength conversion plate 14 in each production step. Further, 22a to 22f are cross-sectional views respectively along the cutting line IIA-IIA to the cutting line IIF-IIF illustrated in the top view of each production step.

Figure 2B:
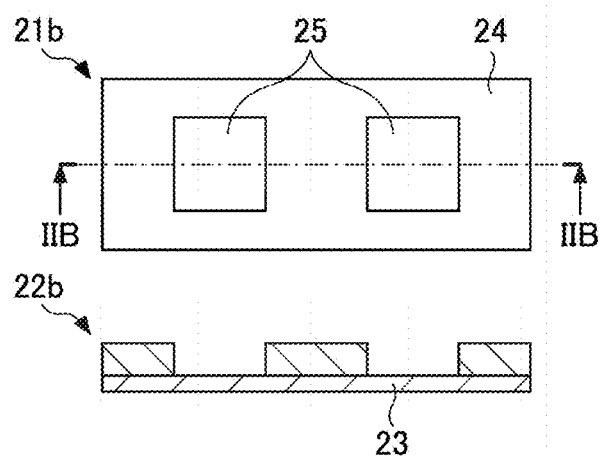

First, as illustrated in FIG. 2A, a wavelength conversion member 24 included in the second region 142 is applied and cured on a base 23. Subsequently, as illustrated in FIG. 2B, a plurality of recessed portions 25 each having a substantially rectangular shape in a plan view are formed in the wavelength conversion member 24 on the base 23 by a punching process. The recessed portion 25 is a hole penetrating the wavelength conversion member 24 and reaches the surface of the base 23. The number of recessed portions 25 can be adjusted as appropriate according to the number of wavelength conversion plates 14 produced from one base 23. Note that the recessed portion 25 need not necessarily penetrate the wavelength conversion member 24.

Figure 2C:
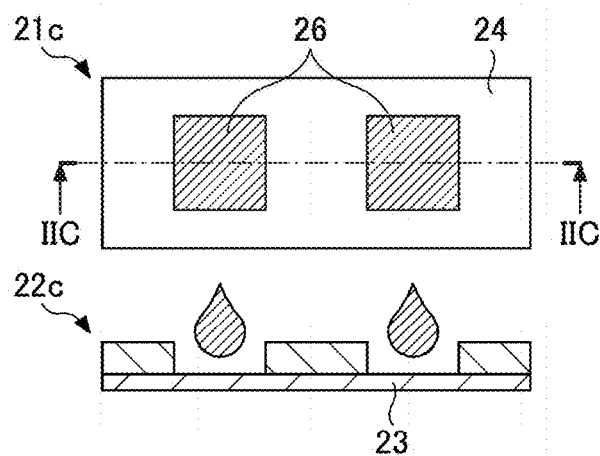
Figure 2D:
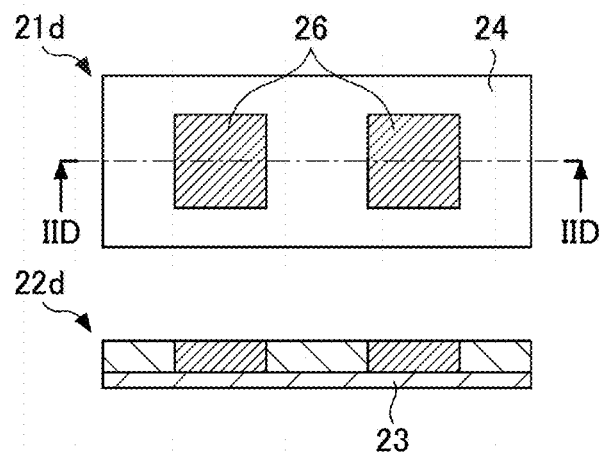

Subsequently, as illustrated in FIG. 2C, liquid droplets for a wavelength conversion member 26 included in the first region 141 are supplied into the recessed portions 25 formed in FIG. 2B by a potting process. Subsequently, as illustrated in FIG. 2D, the droplets of the wavelength conversion member 26 supplied into the recessed portions 25 are cured.

Figure 2E:
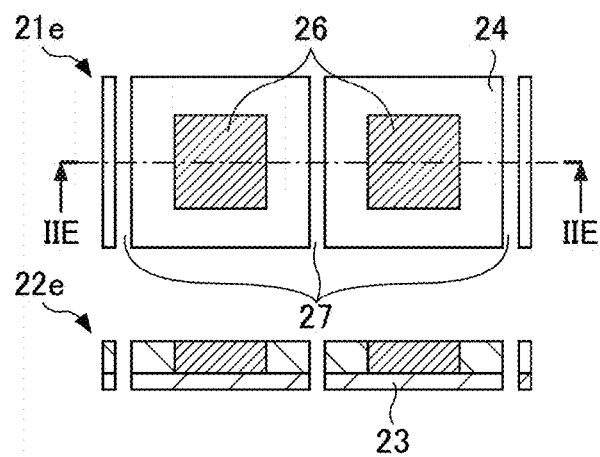
Figure 2F:
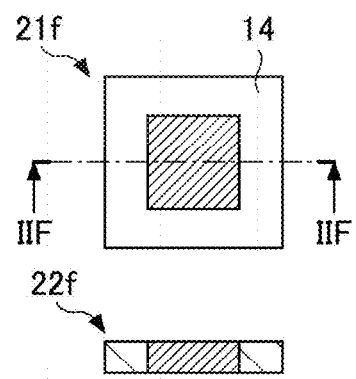

Subsequently, as illustrated in FIG. 2E, the wavelength conversion member 24 and the base 23 are cut to desired sizes by a cutting process. A cut portion 27 represents a portion cut by the cutting process. Subsequently, as illustrated in FIG. 2F, the base 23 is removed. Thus, the wavelength conversion plate 14 is completed.

The wavelength conversion plate 14 can be produced by such production steps. Note that the production method of the wavelength conversion plate 14 may include steps other than the steps illustrated in FIGS. 2A to 2F.

Figure 3A:
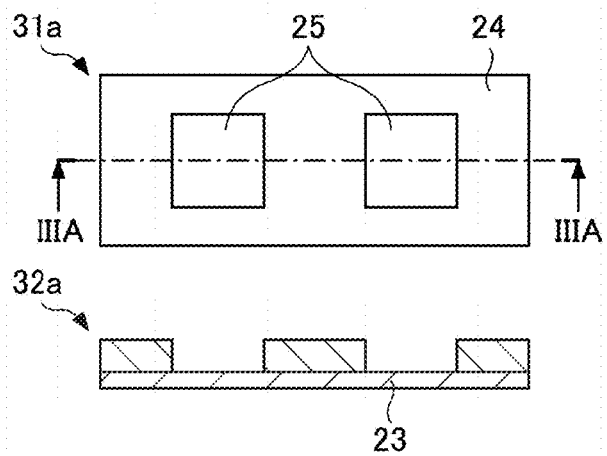
FIGS. 3A and 3B are schematic diagrams illustrating another example of the method for producing the wavelength conversion plate in the light emitting device according to the first embodiment, FIGS. 3A and 3B being schematic diagrams illustrating a portion of the production steps.
Figure 3B:
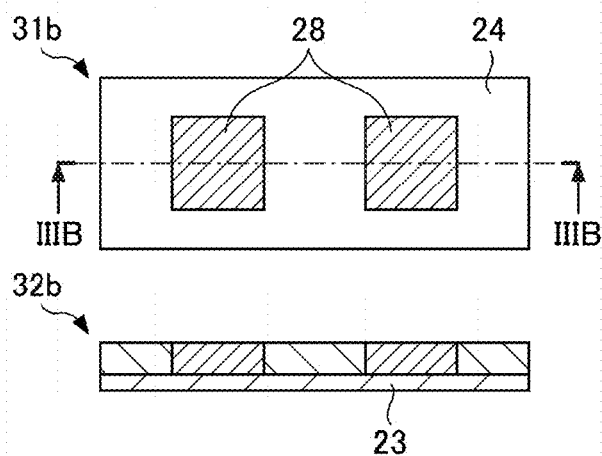

Next, FIGS. 3A and 3B are schematic diagrams for explaining another example of the production method of the wavelength conversion plate 14 in the light emitting device 1. FIG. 3A and FIG. 3B are schematic diagrams illustrating a part of the production steps. In FIGS. 3A and 3B, 31a and 31b represent top views of the wavelength conversion plate 14 in a part of the production steps. Further, 32a and 32b are cross-sectional views respectively along the cutting line IIIA-IIIA and the cutting line IIIB-IIIB illustrated in the top view of each production step.

FIG. 3A illustrates a state in which, similar to the production steps illustrated in FIGS. 2A and 2B, the recessed portions 25 having a substantially rectangular shape in a plan view are formed in the wavelength conversion member 24 on the base 23 by a punching process.

FIG. 3B illustrates a state in which wavelength conversion members 28 formed in advance at a size that can be fitted into the recessed portions 25 are fitted into the recessed portions 25. Subsequently, similar to the production step illustrated in FIG. 2E, the wavelength conversion member 24 and the base 23 are cut to desired sizes by a cutting process. Subsequently, similar to the production step illustrated in FIG. 2F, the base 23 is removed. Thus, the wavelength conversion plate 14 is completed.

The wavelength conversion plate 14 can also be produced by such production steps.

Color Adjustment of Light Emitting Device 1

Figure 4A:
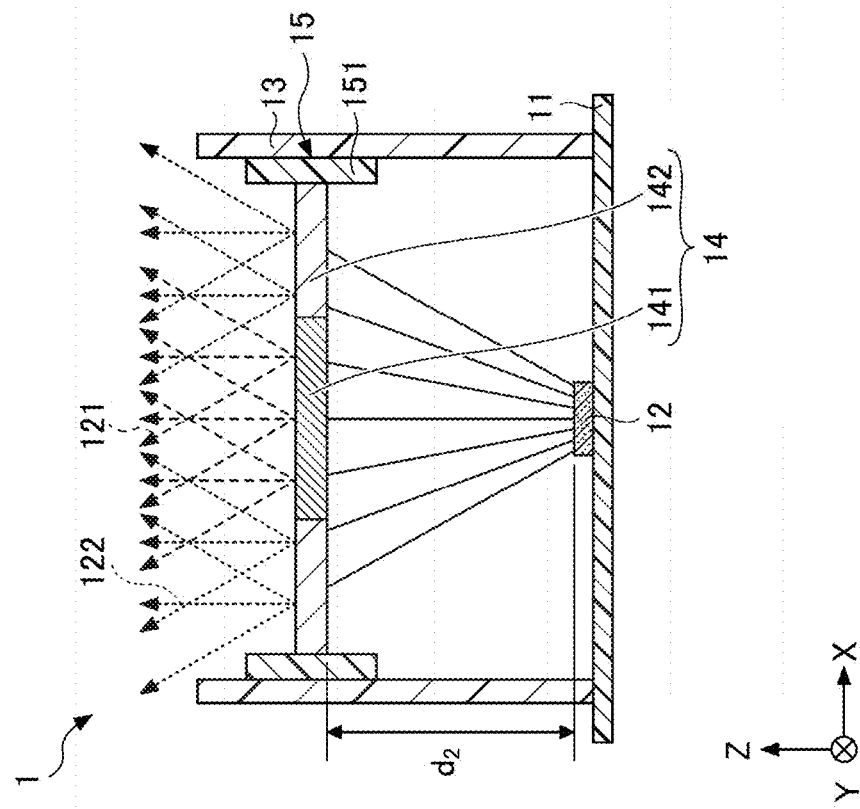
FIGS. 4A and 4B are schematic diagrams for explaining color adjustment of the light emitting device according to the first embodiment, FIG. 4A being a schematic diagram before a color change, and FIG. 4B being a schematic diagram after a color change.
Figure 4B:
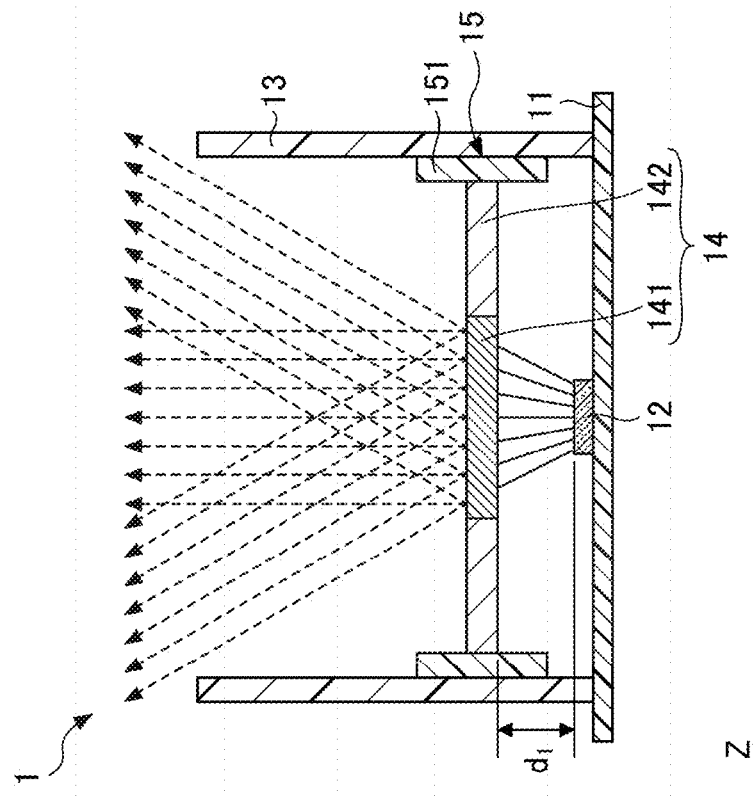

FIGS. 4A and 4B are schematic diagrams for explaining color adjustment of the light emitting device 1. FIG. 4A is a schematic diagram illustrating before a color change, and FIG. 4B is a schematic diagram illustrating after a color change. FIGS. 4A and 4B, similar to FIG. 1B, illustrate a cross section along the cutting line IA-IA of FIG. 1A.

In FIG. 4A, a distance between a surface of the wavelength conversion plate 14 on a light emitting element 12 side and a surface of the light emitting element 12 on the wavelength conversion plate 14 side is $d_1$. In this state, substantially the entire light emitted by the light emitting element 12 passes through the first region 141.

The light emitting device 1 emits the light having the first chromaticity extracted in the first region 141. The wavelength conversion member included in the first region 141 has a light diffusion action due to the wavelength conversion substance, and thus the light extracted from the first region 141 has a higher light diffusivity compared to that of the light emitted by the light emitting element 12. Note that, hereinafter, for ease of explanation, the distance between the surface of the wavelength conversion plate 14 on the light emitting element 12 side and the surface of the light emitting element 12 on the wavelength conversion plate 14 side is referred to as an optical member distance.

FIG. 4B illustrates a state in which the wavelength conversion plate 14 has been raised in the +Z direction from the state illustrated in FIG. 4A and then stopped by the driving of the actuator 15. The optical member distance is $d_2$ ($d_2 > d_1$). In this state, a portion of the light emitted by the light emitting element 12 is transmitted through the first region 141 and the other portion is transmitted through the second region 142.

The light emitting device 1 emits mixed light formed by the light having the first chromaticity extracted in the first region 141 and the light having the second chromaticity extracted in the second region 142 being mixed. The light extracted in each of the first region 141 and the second region 142 has a high light diffusivity with respect to the light emitted by the light emitting element 12 due to the light diffusion action of the wavelength conversion member, and thus the action of suppressing color unevenness or illuminance unevenness of the mixed light is achieved.

Depending on the optical member distance, a ratio of light intensity between the light 121 having the first chromaticity and the light 122 having the second chromaticity changes, changing the chromaticity of the mixed light. The light emitting device 1 can, by changing the optical member distance, adjust the chromaticity of the mixed light and emit color-adjusted light.

Because there is a corresponding relationship between a position of the mover 151 and the chromaticity of the light to be emitted, color adjustment can be precisely achieved when the light emitting device 1 is provided with a detection member that detects the position of the mover 151 and the color is adjusted on the basis of the detection result of the position of the mover 151.

Chromaticity Change Example

Figure 5D:
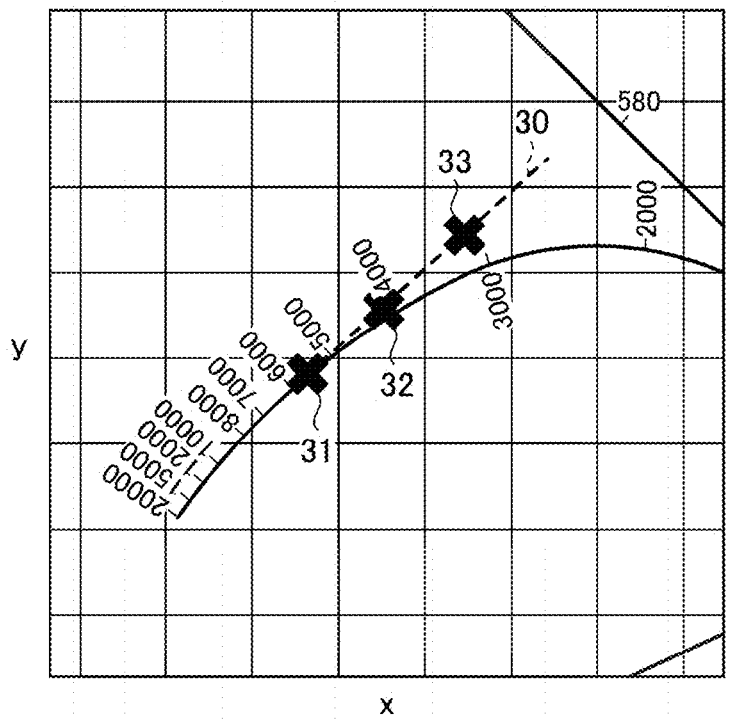

Next, FIGS. 5A to 5D are diagrams illustrating an example of a chromaticity change of the light emitting device 1. FIGS. 5A to 5C are schematic diagrams illustrating states of the light emitting device 1, and FIG. 5D is an xy chromaticity diagram.

In the example illustrated in FIGS. 5A to 5D, in the first region 141, the light emitted by the light emitting element 12 is converted into light of a wavelength corresponding to white (first chromaticity) near chromaticity coordinates (x, y)=(0.33, 0.34) with the color temperature 5500 K in a CIE1931 chromaticity diagram as the target. Further, in the second region 142, the light emitted by the light emitting element 12 is converted into light of a wavelength corresponding to yellow (second chromaticity) that is in a range from 550 nm to 590 nm.

The optical member distance is $d_a$ in FIG. 5A, the optical member distance is $d_b$ in FIG. 5B, and the optical member distance is $d_c$ in FIG. 5C. The optical member distances satisfy $d_a<d_b<d_c$. The xy chromaticity diagram illustrated in FIG. 5D indicates chromaticity with chromaticity coordinates x and y as coordinate axes. Plot 31 in FIG. 5D indicates the chromaticity of the mixed light in the state of FIG. 5A, plot 32 indicates the chromaticity of the mixed light in the state of FIG. 5B, and plot 33 indicates the chromaticity of the mixed light in the state of FIG. 5C.

As shown in FIG. 5D, the chromaticity of the mixed light changes according to the optical member distance. A chromaticity change 30 in FIG. 5D results in a change nearly linear along a line connecting the plots 31, 32, 33. Because the actuator 15 can change the optical member distance to any distance, the light emitting device 1 can change the chromaticity of the light to any chromaticity according to the change in the optical member distance.

Action and Advantageous Effects of Light Emitting Device 1

As described above, the light emitting device 1 includes the light emitting element 12 (light emitting unit), the wavelength conversion plate 14 (optical member) configured to transmit or pass light emitted by the light emitting element 12, and the actuator 15 (movable member) configured to change the distance between the light emitting element 12 and the wavelength conversion plate 14. The actuator 15 changes the distance between the light emitting element 12 and the wavelength conversion plate 14 in the direction along the optical axis 12c of the light emitting element 12.

The wavelength conversion plate 14 includes the first region 141 in which the light 121 having the first chromaticity can be extracted and the second region 142 in which the light 122 having the second chromaticity different from the first chromaticity can be extracted, and can extract, of the light emitted by the light emitting element 12, mixed light formed by light being transmitted or passed through each of the first region 141 and the second region 142 and then being mixed.

In this embodiment, the optical member distance between the light emitting element 12 and the wavelength conversion plate 14 is changed by the actuator 15, and consequently, the ratio of the light intensity between the light 121 having the first chromaticity and the light 122 having the second chromaticity is changed according to the optical member distance, thereby changing the chromaticity of mixed light. The light emitting device 1 can change the chromaticity of light to any chromaticity according to the change in the optical member distance caused by the actuator 15. This makes it possible to provide a light emitting device having a high degree of freedom in color adjustment of light.

Further, in this embodiment, the first region 141 includes the wavelength conversion member configured to convert the light emitted by the light emitting element 12 into light of the first wavelength, and the second region 142 includes the wavelength conversion member configured to convert the light emitted by the light emitting element 12 into light of the second wavelength. In this embodiment, the first wavelength and the second wavelength may be different or may be the same. In a case in which the first wavelength and the second wavelength are different, the wavelength conversion member in the first region and the wavelength conversion member in the second region include wavelength conversion substances different from each other, for example. In a case in which the first wavelength and the second wavelength are the same, the wavelength conversion substances included in the wavelength conversion member in the first region and the wavelength conversion member in the second region may be the same with different concentrations, for example. Further, in a case in which there are a plurality of types of wavelength conversion substances included in both the wavelength conversion member in the first region and the wavelength conversion member in the second region and the same types of wavelength conversion substances are included in these members, blending ratios of the wavelength conversion substances included in the first region and the second region may be different.

As the wavelength conversion members included in each of the first region 141 and the second region 142, members that convert wavelengths to a variety of wavelengths can be selected, making it possible to mix the light converted by each wavelength conversion member and thus further increase the degree of freedom of color adjustment of light. Further, the wavelength conversion member further diffuses the light emitted by the light emitting element 12, making it possible to suitably suppress the color unevenness or the illuminance unevenness of the mixed light.

Further, in this embodiment, the second region 142 surrounds the first region 141. As a result, for example, in the plane including the first region 141, anisotropy of the color mixture of the light converted in the second region 142 and the light converted in the first region 141 is suppressed, making it possible to suppress the color unevenness of the light color-adjusted in the light emitting device 1. From the viewpoint of suppressing color unevenness, the second region 142 is preferably around the first region 141, surrounding the first region 141.

Further, although white light is exemplified as the first chromaticity and yellow light is exemplified as the second chromaticity in this embodiment, the chromaticity of each is not limited thereto, and the first chromaticity and the second chromaticity can be selected as appropriate according to the application of the light emitting device 1.

Furthermore, in this embodiment, the second region 142 may include a passing portion through which the light emitted by the light emitting element 12 passes without wavelength conversion. The passing portion includes a material having light transmittance with respect to, of the light emitted by the light emitting element 12, at least wavelengths of visible light. The wavelength of visible light is in a range from 380 nm to 780 nm.

In the second region 142, light emitted by the light emitting element 12 and passed through the passing portion can be extracted as the light having the second chromaticity. The second region 142 is, for example, glass or a resin such as polycarbonate or silicone.

At this time, the wavelength conversion plate 14 can be produced by, for example, fitting a member constituting the first region 141 into a through hole of a plate-shaped member configured to include a material having light transmittance with respect to visible light, the through hole being formed at a position corresponding to the first region 141.

Note that the first region 141 can also be configured to include a passing portion through which light emitted by the light emitting element 12 passes without wavelength conversion. That is, a wavelength conversion plate in which only one of the first region 141 or the second region 142 includes a wavelength conversion substance can also be used.

First Modified Example of First Embodiment

Next, a light emitting device 1a according to a first modified example of the first embodiment will be described. Note that components that are the same as those described in the above-mentioned embodiment will be denoted by the same reference numerals, and redundant descriptions thereof will be omitted as appropriate. This is also true for each of the following embodiments and modified examples.

Configuration Example of Light Emitting Device 1a

Figure 6A:
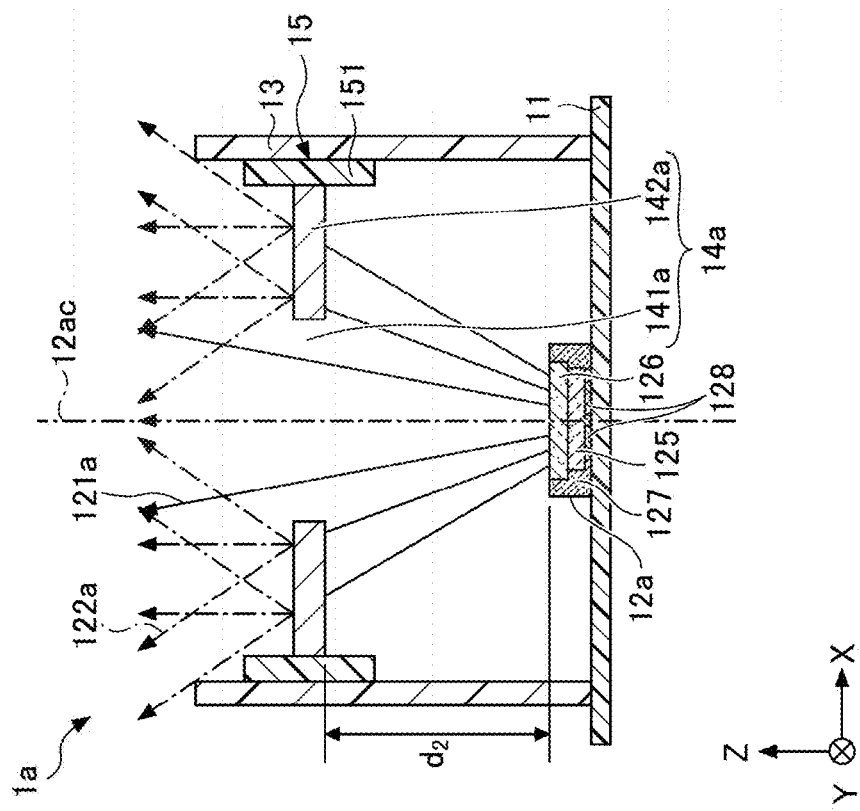
FIGS. 6A and 6B are cross-sectional views illustrating a configuration example of a light emitting device according to a first modified example of the first embodiment, FIG. 6A being a view before a color change, and FIG. 6B being a view after a color change.
Figure 6B:
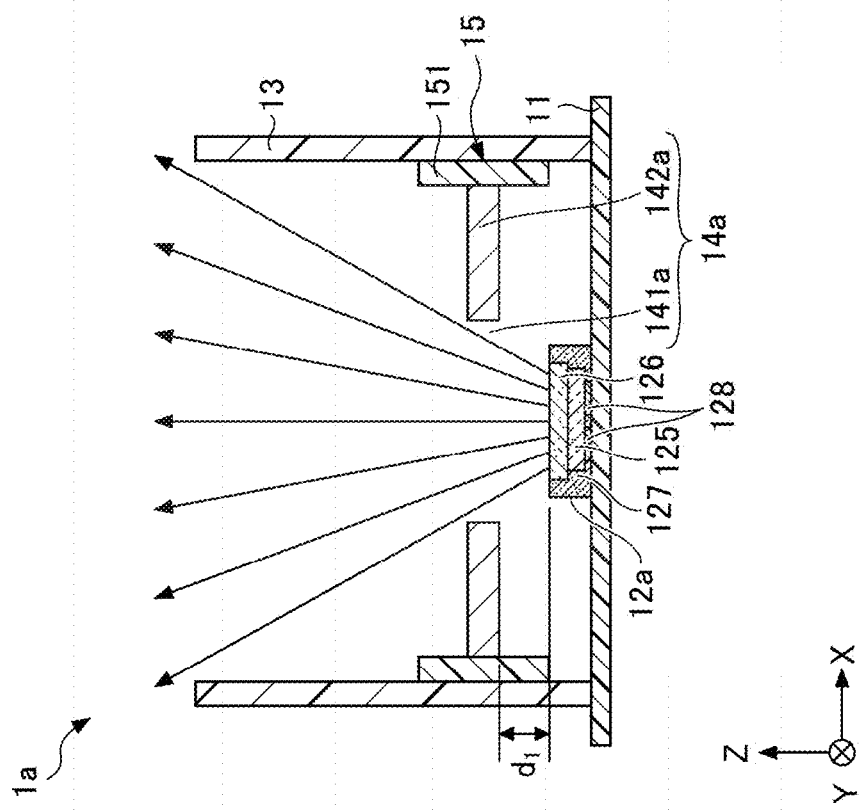

FIGS. 6A and 6B are cross-sectional views illustrating an example of a configuration of the light emitting device 1a. FIG. 6A is a view illustrating before a color change, and FIG. 6B is a view illustrating after a color change. FIGS. 6A and 6B illustrate cross sections including a first region and a second region of a filter plate of the light emitting device 1a.

As illustrated in FIGS. 6A and 6B, the light emitting device 1a includes a filter plate 14a and an LED 12a. The filter plate 14a is an example of an optical member including a first region 141a in which light having the first chromaticity can be extracted and a second region 142a in which light having the second chromaticity different from the first chromaticity can be extracted, and is configured to transmit or pass light emitted by the LED 12a.

The first region 141a is provided in a central portion of the filter plate 14a formed into a plate shape, and includes a passing portion that is a through hole through which the light emitted by the LED 12a passes. This passing portion is formed into a substantially rectangular shape in a plan view. In the first region 141a, the light emitted by the LED 12a and passed through the first region 141a can be extracted as the light having the first chromaticity. In FIGS. 6A and 6B, light 121a having the first chromaticity is indicated by a solid line.

The second region 142a is a region around the first region 141a of the filter plate 14a, surrounding the first region 141a, and has an outer shape formed into a substantially rectangular shape in a plan view. The second region 142a includes a color filter that transmits, of the light emitted by the LED 12a, the light of the second wavelength. In the second region 142a, the light of the second wavelength that has passed through the color filter can be extracted as the light having the second chromaticity. In FIGS. 6A and 6B, light 122a having the second chromaticity is indicated by a dot-dash line.

The color filter included in the second region 142a is a member containing a dye substance composed of an inorganic compound or an organic compound including a metal oxide, with a resin, such as silicone, or glass as a base material, for example. The dye substance is a member that absorbs at least a portion of primary light emitted by the LED 12a and transmits secondary light including a portion of wavelengths included in the primary light.

The filter plate 14a can be produced by forming a through hole corresponding to the first region 141a in a plate-shaped member including the color filter.

The LED 12a is an example of a light emitting unit that emits light and is mounted on the surface of the light emitting unit mounting substrate 11 on the +Z direction side. The LED 12a emits white light, for example. The LED 12a includes at least a light emitting element 125 including at least one pair of electrodes 128 having different polarities, a wavelength conversion member 126 disposed on the light emitting element 125 and containing a wavelength conversion substance, and a covering member 127 having light reflectivity and covering at least a lateral surface of the light emitting element 125 and a lateral surface of the wavelength conversion member 126. A shape of the LED 12a in a plan view is, for example, a square with one side being in a range from 1 mm to 3 mm.

As the light emitting element 125 of the LED 12a, an element that is the same as the light emitting element 12 illustrated in the first embodiment can be used. Further, as the wavelength conversion member 126 of the LED 12a, a member that is the same as the wavelength conversion member included in the wavelength conversion plate 14 described in the first embodiment can be used. A shape of the light emitting element 125 of the LED 12a in a plan view and a shape of the wavelength conversion member 126 of the LED 12a in a plan view are each, for example, a square with one side being in a range from 0.5 mm to 2 mm. In a plan view, a size of the wavelength conversion member 126 is preferably equivalent to or larger than that of the light emitting element 125.

The covering member 127 preferably has light reflectivity in order to extract light from the light emitting element 125 toward an upper surface side (+Z direction), and preferably has an outer peripheral width of 50 μm or greater in a plan view. For example, the light reflectivity of the covering member 127 with respect to an emission peak wavelength of the light emitting element 125 is preferably 70% or greater, more preferably 80% or greater, and even more preferably 90% or greater. Further, the covering member 127 is preferably white, and preferably contains a white pigment, such as titanium oxide, magnesium oxide, or the like, for example, in the base material of the covering member 127. Examples of the base material of the covering member 127 include a resin such as silicone, epoxy, phenol, polycarbonate, acrylic, and the like, or a modified resin thereof.

Note that the light emitting unit of the light emitting device 1a is not limited to the LED 12a, and various types of light sources such as a xenon lamp can be utilized. However, it is preferable that the light emitting device 1a emits white light in order for the filter plate 14a to selectively transmit light of various wavelengths.

Color Adjustment of Light Emitting Device 1a

In FIG. 6A, the optical member distance between a surface of the filter plate 14a on the −Z direction side and a surface of the LED 12a on the +Z direction side is $d_1$. In this state, almost all of the light emitted by the LED 12a passes through the entire first region 141a. The light emitting device 1a emits the light of the first chromaticity extracted in the first region 141a.

FIG. 6B illustrates a state in which the filter plate 14a has been raised in the +Z direction from the state illustrated in FIG. 6A and then stopped by the driving of the actuator 15. The optical member distance is $d_2$ ($d_2 > d_1$). In this state, a portion of the light emitted by the LED 12a passes through the first region 141a and the other portion is transmitted through the second region 142a.

The light emitting device 1a emits mixed light formed by the light having the first chromaticity extracted in the first region 141a and the light having the second chromaticity extracted in the second region 142a being mixed. Depending on the optical member distance, a ratio of light intensity between the light 121a having the first chromaticity and the light 122a having the second chromaticity changes, changing the chromaticity of the mixed light. The light emitting device 1a can, by changing the optical member distance, adjusted the chromaticity of the mixed light and emit color-adjusted light.

Action and Advantageous Effects of Light Emitting Device 1a

As described above, the light emitting device 1a includes the LED 12a (light emitting unit), the filter plate 14a (optical member) configured to transmit or pass light emitted by the LED 12a, and the actuator 15 (movable member) configured to change the distance between the LED 12a and the filter plate 14a. The actuator 15 changes the distance between the LED 12a and the filter plate 14a in the direction along an optical axis 12ac of the LED 12a.

The filter plate 14a includes the first region 141a in which the light 121a having the first chromaticity can be extracted and the second region 142a in which the light 122a having the second chromaticity different from the first chromaticity can be extracted, and can extract, of the light emitted by the LED 12a, mixed light formed by the light passed through the first region 141a and the light transmitted through the second region 142a being mixed.

The light emitting device 1a changes the chromaticity of the mixed light by changing the distance between the LED 12a and the filter plate 14a by the actuator 15. The light emitting device 1a can change the chromaticity of the light to any chromaticity according to the change in the optical member distance caused by the actuator 15. This makes it possible to provide a light emitting device having a high degree of freedom in color adjustment of light.

Further, in this embodiment, the filter plate 14a is configured to including a color filter, making it possible to fabricate the optical member with ease at low cost.

Second Modified Example of First Embodiment

Next, FIGS. 7A and 7B are cross-sectional views illustrating an example of a configuration of a light emitting device 1b according to a second modified example of the first embodiment. FIG. 7A is a view illustrating before a color change, and FIG. 7B is a view illustrating after a color change. FIGS. 7A and 7B illustrate cross sections including a first region and a second region of a filter plate of the light emitting device 1b.

As illustrated in FIGS. 7A and 7B, the light emitting device 1b includes a filter plate 14b. The filter plate 14b includes a first region 141b and a second region 142b.

The first region 141b is provided in a central portion of the filter plate 14b formed into a plate shape, and includes a color filter that transmits, of the light emitted by the LED 12a, the light of a first wavelength. The first region 141b is formed into a substantially rectangular shape in a plan view. In the first region 141b, light emitted by the LED 12a and transmitted through the first region 141b can be extracted as the light having the first chromaticity. In FIGS. 7A and 7B, light 121b having the first chromaticity is indicated by a dot-dash line.

The second region 142b is a region around the first region 141b of the filter plate 14b, surrounding the first region 141b, and has an outer shape formed into a substantially rectangular shape in a plan view. The second region 142b includes a passing portion through which the light emitted by the LED 12a passes without wavelength conversion. The passing portion included in the second region 142b includes a material having light transmittance with respect to at least the wavelengths of visible light of the light emitted by the LED 12a. The wavelength of visible light is in the range from 380 nm to 780 nm.

In the second region 142a, light emitted by the LED 12a and passed through the passing portion can be extracted as the light having the second chromaticity. The second region 142a is, for example, glass or a resin such as polycarbonate or silicone. In FIGS. 7A and 7B, the light of the LED 12a and light 122b having the second chromaticity are indicated by solid lines.

The filter plate 14b can be produced by fitting a member constituting the first region 141b into a through hole of a plate-shaped member configured to include a material having light transmittance with respect to visible light, the through hole being formed at a position corresponding to the first region 141b, or the like.

The color adjustment action and advantageous effects of the light emitting device 1b are similar to those of the light emitting device 1a. Note that although examples have been illustrated in which either the first region or the second region is a filter plate including a color filter in the light emitting device 1b according to this modified example and the light emitting device 1a according to the first modified example, a filter plate including a color filter can be used for both the first region and the second region. Further, one of the first region and the second region can be a filter plate including a color filter, and the other can be a wavelength conversion plate including a wavelength conversion substance.

Third Modified Example of First Embodiment

FIGS. 8A and 8B are cross-sectional views illustrating an example of a configuration of a light emitting device 1c according to a third modified example of the first embodiment. FIG. 8A is a view illustrating before a color change, and FIG. 8B is a view illustrating after a color change. FIGS. 8A and 8B illustrate cross sections including a first region and a second region of a wavelength conversion plate of the light emitting device 1c.

As illustrated in FIGS. 8A and 8B, the light emitting device 1c includes a light diffusion unit 16. The light diffusion unit 16 is provided on a side opposite to the light emitting element 12 with the wavelength conversion plate 14 interposed between the light diffusion unit 16 and the light emitting element 12, and is configured to diffuse light transmitted or passed through the wavelength conversion plate 14.

The light diffusion unit 16 is configured to include a metal or a resin material, and is a plate-shaped member having an uneven shape in which a width and a height, being in the same range as or greater than the wavelength of the light emitted by the light emitting element 12, vary randomly depending on the position. The uneven shape diffuses the light passing through the light diffusion unit 16.

However, the light diffusion unit 16 is not limited to the above, and may be any appropriate member as long as a member that diffuses transmitted light. For example, the light diffusion unit may be configured to include a resin material containing scattering particles.

The color adjustment action of the light emitting device 1c is similar to that of the light emitting device 1 described above.

Action and Advantageous Effects of Light Emitting Device 1c

The light transmitted through the light diffusion unit 16 has a higher light diffusivity with respect to the light transmitted through the wavelength conversion plate 14 due to a light diffusion action of the light diffusion unit 16. As a result, the color unevenness or the illuminance unevenness of the light mixed upon transmission through the wavelength conversion plate 14 can be suppressed.

Although FIGS. 8A and 8B illustrate a configuration in which the light emitting device 1c includes the wavelength conversion plate 14, the light emitting device 1c may include a filter plate instead of the wavelength conversion plate 14. Although the color unevenness or the illuminance unevenness of the mixed light tends to increase due to the low light diffusivity of the filter plate with respect to the wavelength conversion plate, by providing the light diffusion unit 16, such unevenness can suitably be suppressed.

Further, instead of providing the light diffusion unit 16, light diffusivity can be enhanced and the color unevenness or the illuminance unevenness of the mixed light can be suppressed, by forming an uneven shape or the like on at least one surface of the wavelength conversion plate or the filter plate on the +Z direction side or the −Z direction side to roughen the surface. Alternatively, at least one of the first region and the second region of the wavelength conversion plate or the filter plate may be configured to include a resin material containing scattering particles.

Further, the light diffusion unit 16 also functions as a cover for the light emitting device 1c and thus, by providing the light diffusion unit 16, foreign matter can be prevented from entering the light emitting device 1c or the like, and the aesthetic appeal of the light emitting device 1c can be improved.

Second Embodiment

Configuration Example of Light Emitting Device 1d

FIGS. 9A and 9B are cross-sectional views illustrating a configuration of a light emitting device 1d according to a second embodiment. FIG. 9A is a view illustrating before a color change, and FIG. 9B is a view illustrating after a color change. FIGS. 9A and 9B illustrate a cross section including a first region and a second region of a wavelength conversion plate of the light emitting device 1d.

As illustrated in FIGS. 9A and 9B, the light emitting device 1d includes a Fresnel lens 17 and an actuator 15d.

The Fresnel lens 17 is an example of a light emission side light distribution member disposed between the light emitting element 12 and the wavelength conversion plate 14 and configured to define a distribution of light from the light emitting element 12, and is an example of a lens included in the light emission side light distribution member.

The Fresnel lens 17 is a lens formed so that a curved surface of the lens is divided into regions having substantially concentric circular shapes and folded within a desired thickness. As illustrated in FIGS. 9A and 9B, the Fresnel lens 17 has a saw blade-like cross-sectional shape. Further, the Fresnel lens 17 has a substantially concentric circular shape axisymmetric about the optical axis 12c of the light emitting element 12.

Optical characteristics of the Fresnel lens 17, such as light distribution characteristics, can be selected as appropriate according to the application of the light emitting device 1d. The optical characteristics of the Fresnel lens 17 can be determined by widths or heights of the circles in the substantially concentric circular shape, and the like. Such a Fresnel lens 17 can be produced by injection molding of a resin material or the like.

The Fresnel lens 17 is attached to a surface of the wavelength conversion plate 14 on the −Z direction side. However, the Fresnel lens 17 may be adhered to the surface of the wavelength conversion plate 14 on the −Z direction side using an adhesive or the like, and the Fresnel lens 17 and the wavelength conversion plate 14 may be integrally formed.

The light emitted by the light emitting element 12 enters the Fresnel lens 17 and, after being changed in propagation direction due to refraction or diffraction by the Fresnel lens 17, enters the wavelength conversion plate 14. The converted light of each of the first region 141 and the second region 142 included in the wavelength conversion plate 14 is mixed.

The actuator 15d is an example of a movable member that changes the distance between the light emitting element 12 and the Fresnel lens 17. The actuator 15d changes the distance between the light emitting element 12 and the Fresnel lens 17, as a result, the chromaticity of the mixed light is changed. The configuration of the actuator 15d is similar to that of the actuator 15, with the targets for which the distance is changed differing from those of the actuator 15.

Action and Advantageous Effects of Light Emitting Device 1d

In this embodiment, the Fresnel lens 17 (light emission side light distribution member) is provided between the light emitting element 12 and the wavelength conversion plate 14, thereby changing a light distribution angle of the light transmitted through the Fresnel lens 17. As a result, the light distribution angle of the light color-adjusted by the light emitting device 1d can be changed. Further, the substantially concentric circular shape of the Fresnel lens 17 can be made eccentric with respect to the optical axis 12c of the light emitting element 12, and the direction in which the color-adjusted light is emitted can also be changed.

Further, by disposing the Fresnel lens 17 between the light emitting element 12 and the wavelength conversion plate 14, a spread of light emitted by the light emitting element 12 can be suppressed, and thus an area of the wavelength conversion plate 14 and a size of the light emitting device 1d can be reduced. Further, a distance across which the wavelength conversion plate 14 is moved by the actuator 15d can be shortened compared to a case in which the Fresnel lens 17 is not disposed, making it possible to reduce the size of the light emitting device 1d in this regard as well.

Note that the advantageous effects other than those described above are similar to those indicated in the first embodiment.

Further, although this embodiment exemplifies a configuration in which the Fresnel lens 17 is attached to the surface of the wavelength conversion plate 14 on the −Z direction side, the position is not limited thereto, and the Fresnel lens 17 may be disposed at any appropriate position as long as between the light emitting element 12 and the wavelength conversion plate 14. That is, the position of the wavelength conversion plate 14 may be fixed, and the Fresnel lens 17 may move between the light emitting element 12 and the wavelength conversion plate 14 by the actuator 15d.

Further, although this embodiment exemplifies the Fresnel lens 17 as the light emission side light distribution member, the member is not limited thereto, and various lenses such as a plano-convex lens, a biconvex lens, a meniscus lens, or a combination thereof can be used as the light emission side light distribution member. However, when the Fresnel lens 17 is used, a thickness of the lens can be reduced, which is more preferable from the perspective of reducing the size of the light emitting device 1d.

Further, although this embodiment exemplifies a configuration in which the light emitting device 1d includes the wavelength conversion plate 14, the configuration may include the filter plate 14a or 14b instead of the wavelength conversion plate 14. Further, the light emitting device 1d need not necessarily include the light diffusion unit 16.

Further, instead of providing the Fresnel lens 17, a substantially concentric circular shape can be formed on at least a portion of the surface of the wavelength conversion plate 14 on the light emitting element 12 side (surface on the –Z direction side). This can cause this surface to function as a Fresnel lens. In this case, the wavelength conversion plate 14 overlaps the light emitting element 12 in a plan view, and includes a light distribution member on the surface of the wavelength conversion plate 14 on the light emitting element 12 side, the light distribution member defining the distribution of the light from the light emitting element 12. That is, the wavelength conversion plate 14 has a substantially concentric circular shape of a Fresnel lens on the surface of the wavelength conversion plate 14 on the light emitting element 12 side.

Here, FIGS. 10A and 10B are cross-sectional views illustrating an example of a configuration of a light emitting device 1da according to a modified example of the second embodiment, FIG. 10A being a view before a color change, and FIG. 10B being a view after a color change. With such a configuration as well, an action and advantageous effects similar to those of the light emitting device 1d can be achieved.

Third Embodiment

Figure 11:
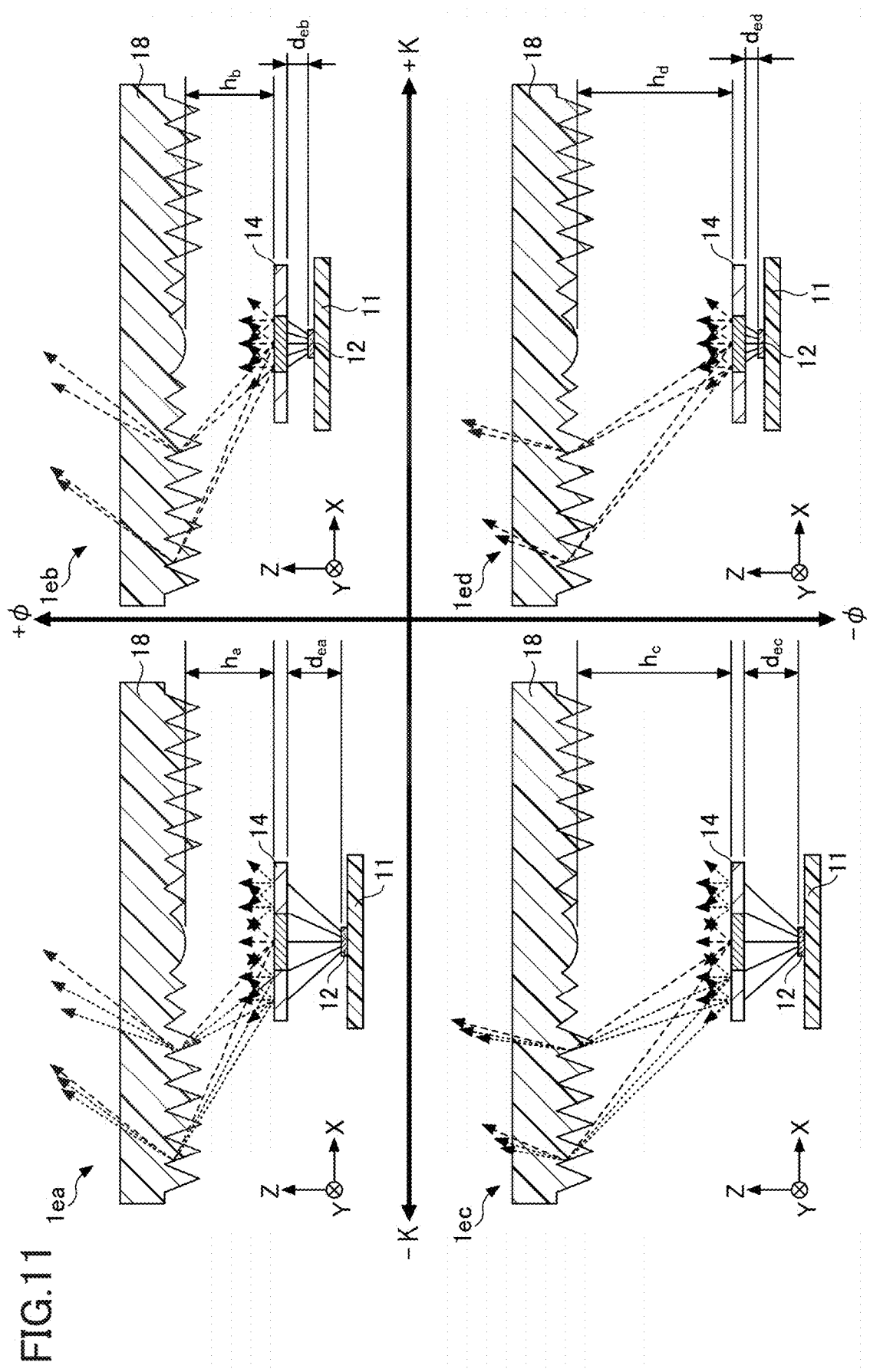
FIG. 11 is a schematic diagram illustrating a first example of a relationship between a light distribution angle and a color temperature of a light emitting device according to a third embodiment.

Relationship Between Light Distribution Angle and Chromaticity in Light Emitting Device 1e Next, FIG. 11 is a schematic diagram illustrating a first example of a relationship between a light distribution angle and a color temperature of a light emitting device 1e according to a third embodiment. An φ axis illustrated in FIG. 11 indicates the distribution angle of light emitted by the light emitting device 1e, and a K axis indicates a color temperature of the light emitted by the light emitting device 1e. A +φ direction indicates a direction in which the light distribution angle widens, and a –φ direction indicates a direction in which the light distribution angle narrows. A +K direction indicates a direction in which the color temperature increases, and a –K direction indicates a direction in which the color temperature decreases.

Further, FIG. 11 illustrates only a portion of the configuration of the light emitting device 1e, and illustrates four states in which the light distribution angle φ and the color temperature K are different as light emitting devices 1ea, 1eb, 1ec, 1ed.

As illustrated in FIG. 11, the light emitting device 1e includes a Fresnel lens 18. The Fresnel lens 18 is an example of an irradiation side light distribution member that defines a distribution of the light transmitted or passed through the wavelength conversion plate 14.

The Fresnel lens 18 is provided on the side opposite to the light emitting element 12 with the wavelength conversion plate 14 interposed between the Fresnel lens 18 and the light emitting element 12, and is movable along the Z axis by an actuator separate from the actuator 15. The configuration of the Fresnel lens 18 is similar to that of the Fresnel lens 17 illustrated in the second embodiment, with the disposed position different from that of the Fresnel lens 17.

The Fresnel lens 18 changes the distribution of light emitted by the light emitting element 12 and transmitted or passed through the wavelength conversion plate 14, thereby changing the distribution angle of the light color-adjusted by the light emitting device 1d.

Here, a distance between an apex of a hemispherical region in a center of the Fresnel lens 18 and a surface of the wavelength conversion plate 14 on the Fresnel lens 18 side is referred to as a lens distance. As illustrated in FIG. 11, a lens distance $h_a$ of the light emitting device 1ea is equal to a lens distance $h_b$ of the light emitting device 1eb, and a lens distance $h_c$ of the light emitting device 1ec is equal to a lens distance $h_d$ of the light emitting device 1ed. The lens distance $h_c$ is longer than the lens distance $h_a$. Accordingly, as the lens distance lengthens, the distribution angle of the light color-adjusted by the light emitting device 1e narrows.

On the other hand, an optical member distance $d_{ea}$ of the light emitting device 1ea is equal to an optical member distance $d_{ec}$ of the light emitting device 1ec, and an optical member distance $d_{eb}$ of the light emitting device 1eb is equal to an optical member distance $d_{ea}$ of the light emitting device 1ed. The optical member distance $d_{ea}$ is longer than the optical member distance $d_{eb}$. Accordingly, as the optical member distance lengthens, the color temperature of the light color-adjusted by the light emitting device 1e lowers.

Figure 12:
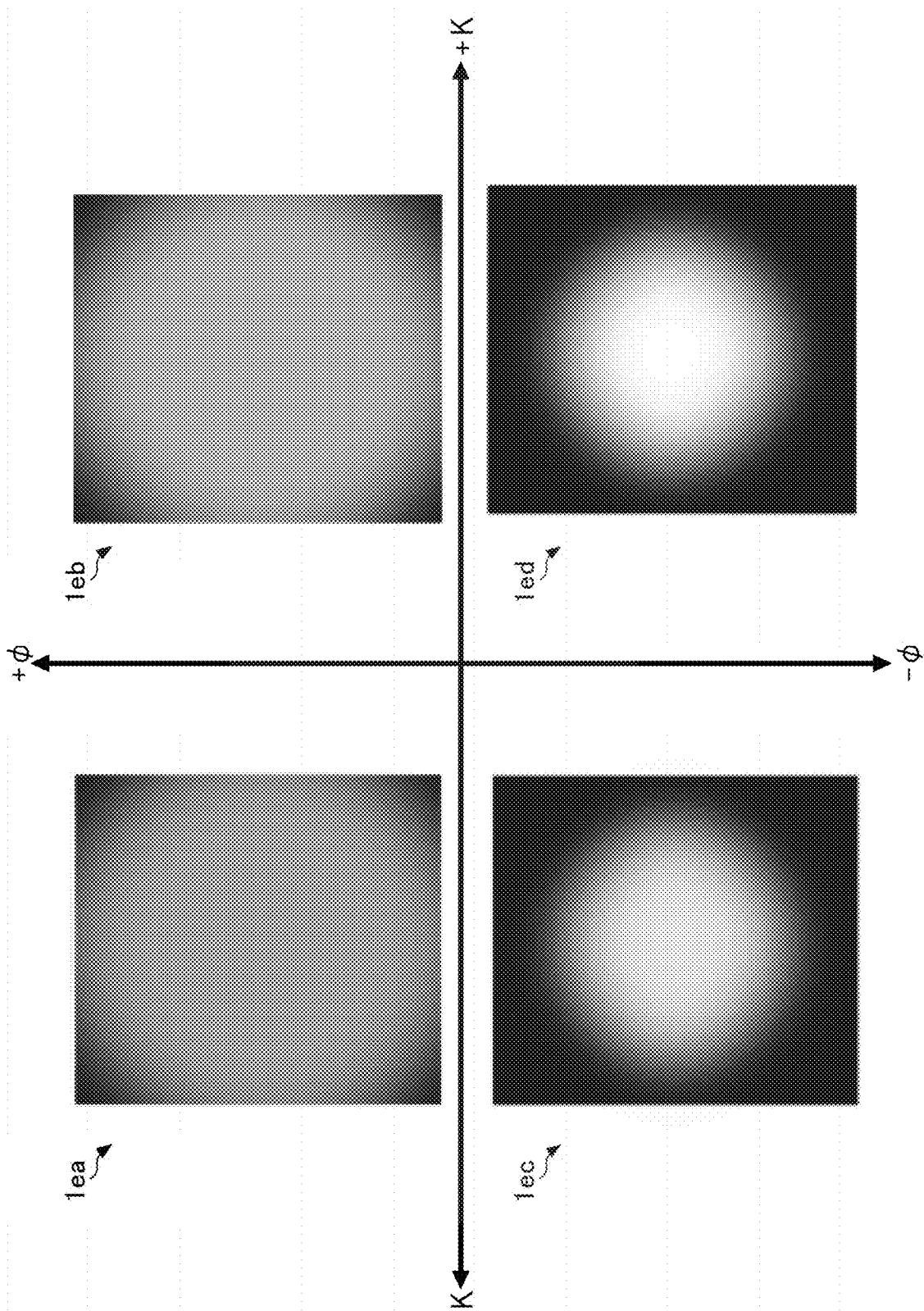
FIG. 12 is an image diagram showing a second example of a relationship between the light distribution angle and the color temperature of the light emitting device according to the third embodiment.

FIG. 12 is an image diagram illustrating a second example of the relationship between the distribution angle and the color temperature of the light emitted by the light emitting device 1e, and shows an image diagram of luminous flux emitted by the light emitting device 1e when viewed from an emission direction side of the light emitting device 1e. Specifically, FIG. 12 shows the light distribution angle φ and the color temperature K of the light emitted in each state of the light emitting devices 1ea, 1eb, 1ec, 1ed as an image diagram.

In FIG. 12, the images shown for the light emitting device 1ec and the light emitting device 1ed have small diameters of luminous flux and narrow light distribution angles compared to those of the images shown for the light emitting device 1ea and the light emitting device 1eb. In FIG. 12, the images shown for the light emitting device 1ea and the light emitting device 1ec have a reddish luminous flux and a low color temperature compared to those of the images shown for the light emitting device 1eb and the light emitting device 1ed.

Action and Advantageous Effects of Light Emitting Device 1e

As described above, in this embodiment, the Fresnel lens 18 (irradiation side light distribution member) that defines the distribution of the light transmitted or passed through the wavelength conversion plate 14 is provided on the side opposite to the light emitting element 12 (light emitting unit)

with the wavelength conversion plate 14 (optical member) interposed between the Fresnel lens 18 and the light emitting element 12.

The light distribution angle φ can be changed by changing the lens distance, and the color temperature can be changed by changing the optical member distance. As a result, the light emitting device 1e can emit light at a desired light distribution angle while increasing the degree of freedom of color adjustment.

Note that, although this embodiment exemplifies a configuration in which the Fresnel lens 18 is moved along the Z axis and the lens distance is changed by an actuator different from the actuator 15, the configuration is not limited thereto. For example, the Fresnel lens 18 may be fixed and the wavelength conversion plate 14 may be moved along the Z axis to change the lens distance. Further, the Fresnel lens 18 and the wavelength conversion plate 14 may be integrated and moved by the actuator 15.

Further, although this embodiment exemplifies a configuration in which the light emitting device 1e includes the wavelength conversion plate 14, the configuration may include the filter plate 14a or 14b instead of the wavelength conversion plate 14.

Further, the advantageous effects other than those described above are the same as those indicated in the first embodiment.

Modified Example of Third Embodiment

FIGS. 13A and 13B are cross-sectional views illustrating an example of a configuration of a light emitting device 1f according to a modified example of the third embodiment. FIG. 13A is a view illustrating before a color change, and FIG. 13B is a view illustrating after a color change. FIGS. 13A and 13B illustrate cross sections including a first region and a second region of a wavelength conversion plate of the light emitting device 1f.

As illustrated in FIGS. 13A and 13B, the light emitting device 1f includes an array lens 19. The array lens 19 is an example of an irradiation side light distribution member that defines a distribution of the light transmitted or passed through the wavelength conversion plate 14.

The array lens 19 is provided on the side opposite to the light emitting element 12 with the wavelength conversion plate 14 interposed between the array lens 19 and the light emitting element 12. Further, the array lens 19 is integrated with the wavelength conversion plate 14 and movable along the Z axis by the actuator 15. Here, the array lens 19 and the wavelength conversion plate 14 being integrated includes a state of separation and a state of contact between the array lens 19 and the wavelength conversion plate 14.

The array lens 19 is an optical element including a plurality of lenses arrayed in two dimensions. The number, spacing, or arrangement of the plurality of the lenses, or the diameter, radius of curvature, shape, and the like of the individual lenses can be selected as appropriate according to the application of the light emitting device 1f. Further, the array lens 19 can also be produced using materials such as glass or resin.

In this way, by providing the array lens 19 on the side opposite to the light emitting element 12 with the wavelength conversion plate 14 interposed between the array lens 19 and the light emitting element 12, the distribution of the light emitted by the light emitting device 1f can be changed from, for example, a Lambert light distribution. Further, an interior of the light emitting device 1f is not visible, making it also possible to improve the aesthetic appeal of the light emitting device 1f.

Note that although this embodiment exemplifies a configuration in which the wavelength conversion plate 14 and the array lens 19 move integrally along the Z axis by the actuator 15, the configuration is not limited thereto. For example, the array lens 19 may be movable along the Z axis independently of the wavelength conversion plate 14 by an actuator different from the actuator 15. Further, although this embodiment exemplifies a configuration in which the light emitting device 1f includes the wavelength conversion plate 14, the configuration may include the filter plate 14a or 14b instead of the wavelength conversion plate 14.

Further, the advantageous effects other than those described above are the same as those indicated in the first embodiment.

Fourth Embodiment

Chromaticity Change Example of Light Emitting Device 1g

Figure 14A:
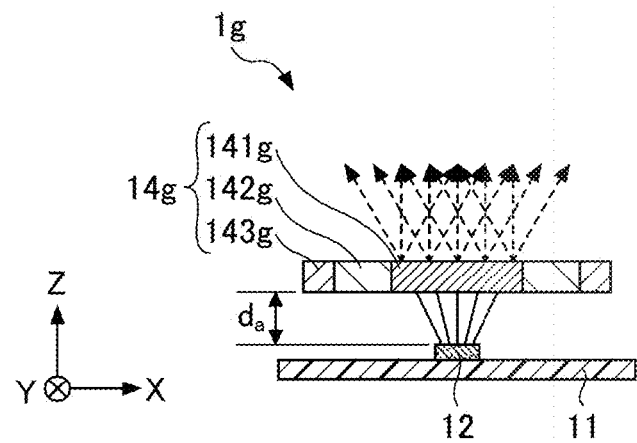
FIGS. 14A to 14D are diagrams illustrating a chromaticity change example of a light emitting device according to a fourth embodiment, FIGS. 14A to 14C being schematic diagrams illustrating states of the light emitting device, and FIG. 14D being an xy chromaticity diagram.
Figure 14B:
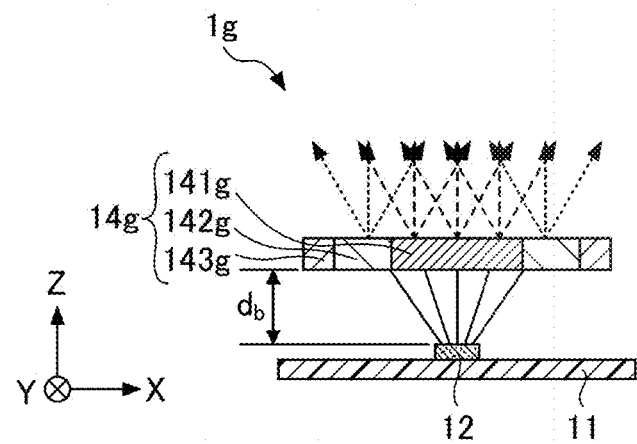
Figure 14C:
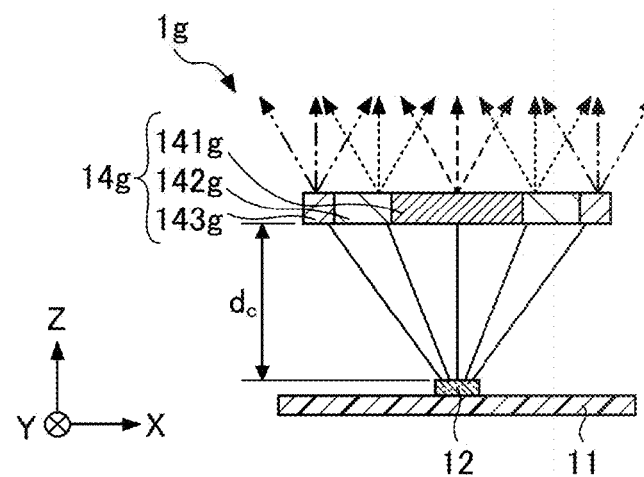
Figure 14D:
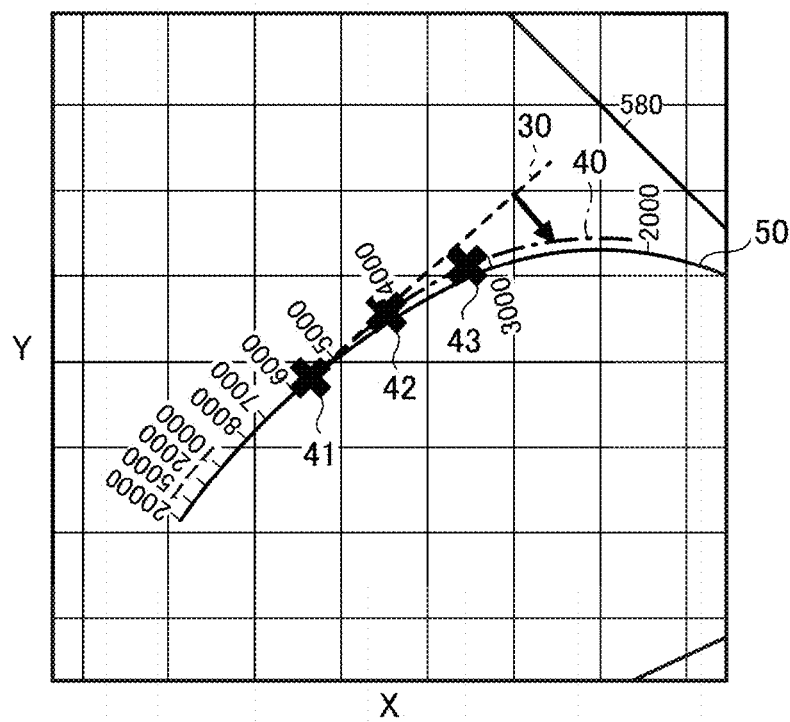

Next, FIGS. 14A to 14D are diagrams illustrating an example of a chromaticity change of a light emitting device 1g according to a fourth embodiment. FIG. 14A to FIG. 14C are schematic diagrams illustrating states of the light emitting device 1g, and FIG. 14D is an xy chromaticity diagram. In FIG. 14A to FIG. 14C, the light emitted by the light emitting element 12 is indicated by a solid line, and the light 121 having the first chromaticity is indicated by a dashed line.

As illustrated in FIGS. 14A to 14D, the light emitting device 1g includes a wavelength conversion plate 14g. Further, the wavelength conversion plate 14g includes a first region 141g, a second region 142g, and a third region 143g. The second region 142g surrounds the first region 141g, and the third region 143g surrounds the second region 142g.

In the third region 143g, light having a third chromaticity different from each of the first chromaticity extracted in the first region 141g and the second chromaticity extracted in the second region 142g can be extracted. The wavelength conversion plate 14g can extract mixed light formed by light transmitted or passed through each of the first region 141g, the second region 142g, and the third region 143g and then being mixed. In FIG. 14A to FIG. 14C, the light emitted by the light emitting element 12 is indicated by a solid line, the light having the first chromaticity is indicated by a dashed line, the light having the second chromaticity is indicated by a dotted line, and the light having a third chromaticity is indicated by a dot-dash line.

In the example illustrated in FIGS. 14A to 14D, in the first region 141g, the light emitted by the light emitting element 12 is converted into light of a wavelength corresponding to white (first chromaticity) near chromaticity coordinates (x, y)=(0.33, 0.34) with the color temperature 5500 K in a CIE1931 chromaticity diagram as the target. Further, in the second region 142g, the light emitted by the light emitting element 12 is converted into light of a wavelength corresponding to yellow (second chromaticity) that is in a range from 550 nm to 590 nm. Further, in the third region 143g, the light emitted by the light emitting element 12 is converted into light of a wavelength corresponding to red (third chromaticity) that is from 640 nm to 770 nm.

The actuator 15 changes a distance between the light emitting element 12 and the wavelength conversion plate 14g, as a result, the chromaticity of the mixed light is changed. The optical member distance is represented as $d_a$ in FIG. 14A, the optical member distance is represented as $d_b$ in FIG. 14B, and the optical member distance is represented as $d_c$ in FIG. 14C. Plot 41 in FIG. 14D indicates the chromaticity of the mixed light in the state of FIG. 14A, plot 42 indicates the chromaticity of the mixed light in the state of FIG. 14B, and plot 43 indicates the chromaticity of the mixed light in the state of FIG. 14C.

As shown in FIG. 14D, the chromaticity of the mixed light changes according to the optical member distance. Here, a blackbody locus 50 shown in FIG. 14D indicates a chromaticity change of irradiated light in a case in which external light energy is fully absorbed and an ideal object (blackbody) that irradiates all energy at 100% is heated. With the chromaticity change 30 of the light emitting device 1 shown in FIG. 5D described above, the plots 31, 32, 33 change substantially linearly, and thus deviate from the curve of the blackbody locus 50.

In contrast, in this embodiment, the third region 143g, in which red light can be extracted, surrounds the second region 142g. Therefore, when the optical member distance increases, the light emitted by the light emitting element 12 reaches the third region 143g, and red light is extracted in the third region 143g. With this, the color of the light emitted by the light emitting device 1g shifts toward red. As a result, a chromaticity change 40 of the mixed light is a change along the blackbody locus 50.

Action and Advantageous Effects of Light Emitting Device 1g

As described above, in this embodiment, the wavelength conversion plate 14g includes the third region 143g in which the light having the third chromaticity different from each of the first chromaticity and the second chromaticity can be extracted, and can extract mixed light formed by light being transmitted through each of the first region 141g, the second region 142g, and the third region 143g and then being mixed.

The actuator 15 changes the distance between the light emitting element 12 and the wavelength conversion plate 14g, as a result, the chromaticity of the mixed light is changed. This chromaticity change 40 of light follows the blackbody locus 50. Accordingly, the light emitting device 1g can extract and emit light that changes in chromaticity along the blackbody locus 50.

Further, although this embodiment exemplifies a configuration in which the light emitting device 1g does not include a light emission side light distribution member such as a Fresnel lens, the light emitting device 1g may include such a light emission side light distribution member. In this case, the actuator 15 changes the distance between the light emitting element 12 and the light emission side light distribution member, as a result, the chromaticity of the mixed light is changed. This chromaticity change of light follows the blackbody locus. Accordingly, an action and advantageous effects similar to those of the light emitting device 1g described above can be achieved.

Further, the light emitting device 1g can also include an irradiation side light distribution member such as a light diffusion unit or an array lens.

Fifth Embodiment

Figure 15A:
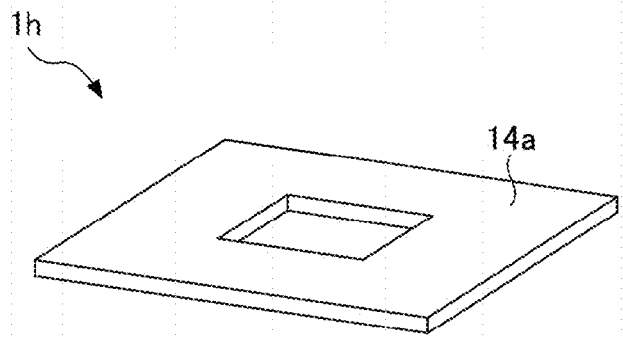
FIGS. 15A to 15D are diagrams of a light emitting device according to a fifth embodiment, FIG. 15A being a schematic diagram of a color filter, FIG. 15B being a schematic diagram of a wavelength conversion plate, and FIGS. 15C and 15D being xy chromaticity diagrams.
Figure 15B:
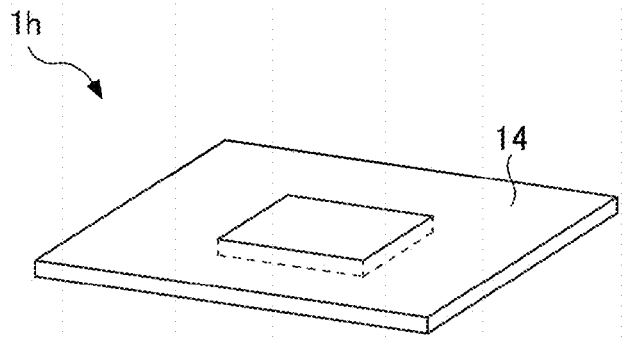
Figure 15C:
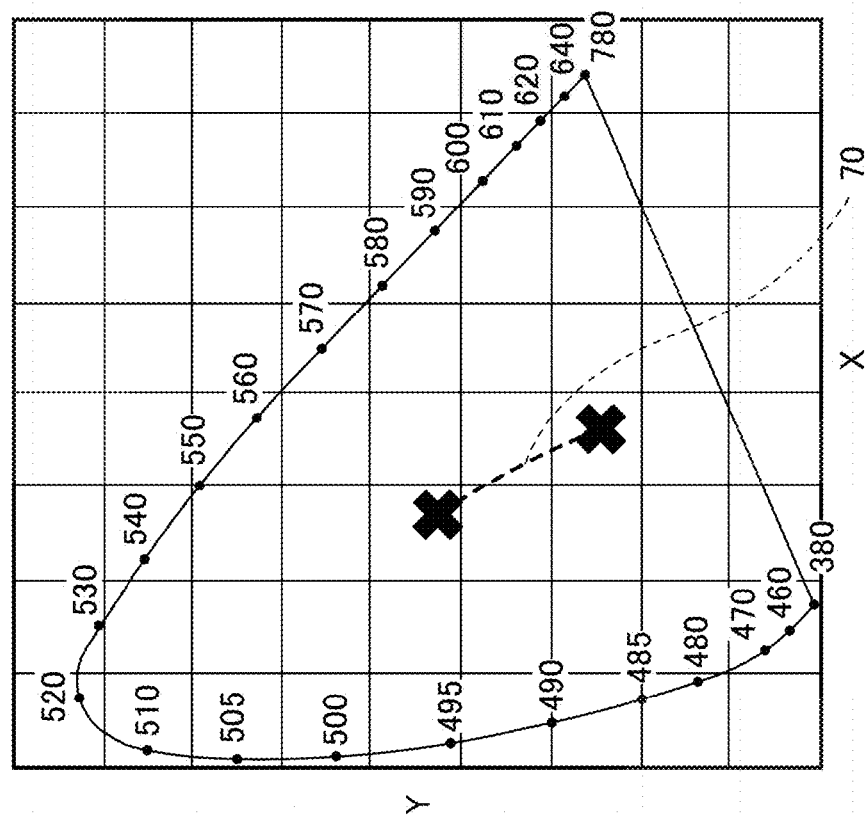
Figure 15D:
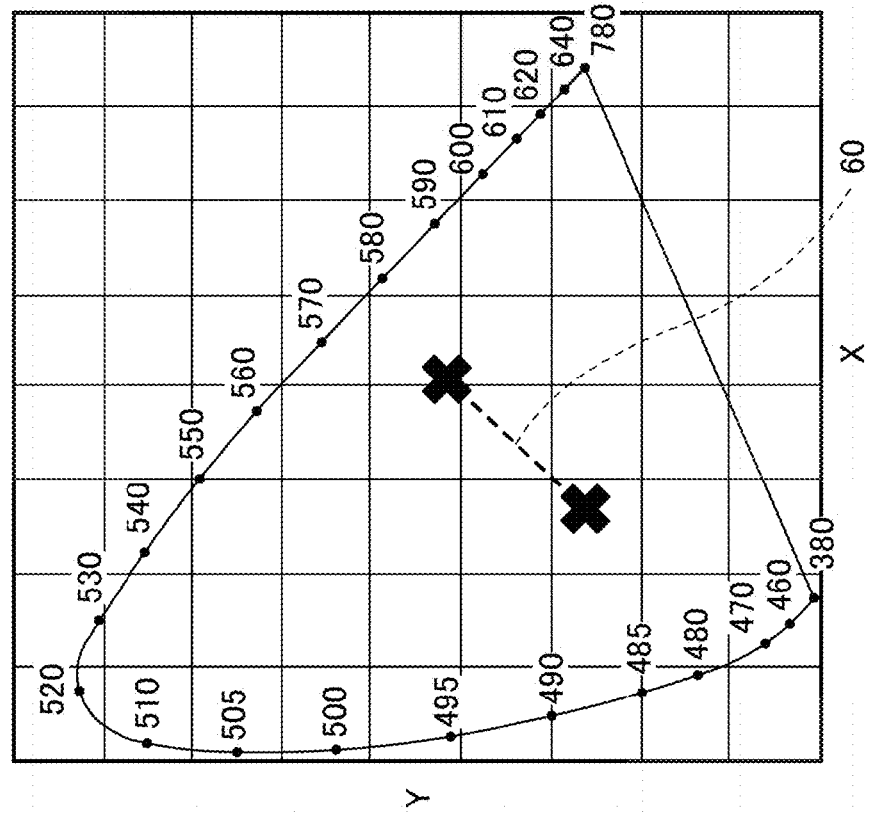

Next, FIGS. 15A to 15D show diagrams for illustrating a light emitting device 1h according to a fifth embodiment. FIG. 15A shows a schematic diagram illustrating the filter plate 14a, FIG. 15B shows a schematic diagram illustrating the wavelength conversion plate 14, and FIGS. 15C and 15D show xy chromaticity diagrams.

The light emitting device 1h is configured so that a plurality of optical members can be attached thereto and detached therefrom, and the filter plate 14a and the wavelength conversion plate 14 can replace each other. For example, in an application for adjusting a color temperature, the filter plate 14a including a first region in which white light emitted by an LED can be extracted and a second region through which light emitted by an LED is transmitted and yellow (warm color) light can be extracted is mounted on the light emitting device 1h.

On the other hand, in another application such as a color cast measure, the wavelength conversion plate 14 including a first region in which magenta light can be extracted and a second region in which green light can be extracted is mounted on the light emitting device 1h. Note that the term "color cast" refers to a state in which the overall color of an image is shifted to a specific color.

The light emitting device 1h, in a case in which the filter plate 14a is mounted, can adjust the color along a chromaticity change 60 from white to yellow, as shown in FIG. 15C. Further, the light emitting device 1h, in a case in which the wavelength conversion plate 14 is mounted, can adjust the color along a chromaticity change 70 from magenta to green as shown in FIG. 15D.

According to the configuration of the light emitting device 1h, color adjustment of an even higher degree of freedom can be achieved. Note that the fifth embodiment can also be combined with the above-described embodiments.

Although the preferred embodiments and the like have been described in detail above, the disclosure is not limited to the above-described embodiments and the like, various modifications and substitutions can be made to the above-described embodiments and the like without departing from the scope described in the claims.

Note that the first region may include a passing portion through which light emitted by the light emitting unit passes, and the second region may include a transmitting portion through which light emitted by the light emitting unit is transmitted.

The light emitting device of the present invention can be suitably utilized for lighting, a camera flash, a vehicle headlight, and the like. However, the light emitting device of the present invention is not limited to these applications.

What is claimed is:

1. A camera flash comprising:
    a light emitting device comprising:
        a light emitting unit;
        an optical member configured to transmit or pass light emitted by the light emitting unit, the optical member comprising:
            a first region configured to transmit or pass light having a first chromaticity; and
            a second region configured to transmit or pass light having a second chromaticity different from the first chromaticity; and
        a movable member configured to move to change a distance between the light emitting unit and the optical member along an optical axis of the light emitting unit.

2. The camera flash according to claim 1, wherein:
    the optical member is configured to extract mixed light that includes light emitted by the light emitting unit and transmitted or passed through the first region, and light emitted by the light emitting unit and transmitted or passed through the second region; and the movable member is configured to change the distance between the light emitting unit and the optical member to change a chromaticity of the mixed light.

3. The camera flash according to claim 1, wherein:
the optical member further comprises a third region configured to transmit or pass light having a third chromaticity different from the first chromaticity and the second chromaticity;
the optical member is configured to extract mixed light that includes light emitted by the light emitting unit and transmitted or passed through the first region, light emitted by the light emitting unit and transmitted or passed through the second region, and light emitted by the light emitting unit and transmitted or passed through the third region; and
the movable member is configured to change the distance between the light emitting unit and the optical member to change a chromaticity of the mixed light so as to follow a blackbody locus.

4. The camera flash according to claim 1, wherein:
the optical member overlaps the light emitting unit in a plan view; and
the light emitting device further comprises a light distribution member on a surface of the optical member on a light emitting unit side, the light distribution member being configured to define a distribution of light from the light emitting unit.

5. The camera flash according to claim 1, wherein the second region surrounds the first region.

6. The camera flash according to claim 1, wherein:
the first region comprises at least one of:
  a passing portion configured to allow the light emitted by the light emitting unit to pass through,
  a color filter configured to transmit light of a first wavelength of the light emitted by the light emitting unit, or
  a wavelength conversion member configured to convert the light emitted by the light emitting unit into the light of the first wavelength; and
the second region includes at least one of:
  a transmitting portion configured to transmit the light emitted by the light emitting unit,
  a color filter configured to transmit light of a second wavelength of the light emitted by the light emitting unit, or
  a wavelength conversion member configured to convert the light emitted by the light emitting unit into the light of the second wavelength.

7. The camera flash according to claim 1, wherein:
the light emitting device further comprises a light diffusion unit configured to diffuse light transmitted or passed through the optical member, the light diffusion unit located on a side opposite to the light emitting unit with the optical member interposed between the light diffusion unit and the light emitting unit.

8. The camera flash according to claim 1, wherein:
the light emitting device further comprises an irradiation side light distribution member located on a side opposite to the light emitting unit with the optical member interposed between the irradiation side light distribution member and the light emitting unit, the irradiation side light distribution member being configured to define a distribution of light transmitted or passed through the optical member.

9. A camera flash comprising:
a light emitting device comprising:
  a light emitting unit;
  an optical member configured to transmit or pass light emitted by the light emitting unit, the optical member comprising:
    a first region configured to transmit or pass light having a first chromaticity; and
    a second region configured to transmit or pass light having a second chromaticity different from the first chromaticity;
  a light emission side light distribution member disposed between the light emitting unit and the optical member, the light emission side light distribution member being configured to define a distribution of light from the light emitting unit; and
  a movable member configured to move to change a distance between the light emitting unit and the light emission side light distribution member in a direction along an optical axis of the light emitting unit.

10. The camera flash according to claim 9, wherein:
the optical member is configured to extract mixed light that includes light emitted by the light emitting unit and transmitted or passed through the first region, and light emitted by the light emitting unit and transmitted or passed through the second region; and
the movable member is configured to change the distance between the light emitting unit and the light emission side light distribution member to change a chromaticity of the mixed light.

11. The camera flash according to claim 9, wherein the light emission side light distribution member comprises a lens.

12. The camera flash according to claim 9, wherein:
the optical member further comprises a third region configured to transmit or pass light having a third chromaticity different from the first chromaticity and the second chromaticity;
the optical member is configured to extract mixed light that includes light emitted by the light emitting unit and transmitted or passed through the first region, light emitted by the light emitting unit and transmitted or passed through the second region, and light emitted by the light emitting unit and transmitted or passed through the third region; and
the movable member is configured to change the distance between the light emitting unit and the optical member to change a chromaticity of the mixed light so as to follow a blackbody locus.

13. The camera flash according to claim 9, wherein the second region surrounds the first region.

14. The camera flash according to claim 9, wherein:
the first region comprises at least one of:
  a passing portion configured to allow the light emitted by the light emitting unit to pass through,
  a color filter configured to transmit light of a first wavelength of the light emitted by the light emitting unit, or
  a wavelength conversion member configured to convert the light emitted by the light emitting unit into the light of the first wavelength; and
the second region includes at least one of:
  a transmitting portion configured to transmit the light emitted by the light emitting unit,
  a color filter configured to transmit light of a second wavelength of the light emitted by the light emitting unit, or
  a wavelength conversion member configured to convert the light emitted by the light emitting unit into the light of the second wavelength.

15. The camera flash according to claim 9, wherein:
the light emitting device further comprises a light diffusion unit configured to diffuse light transmitted or passed through the optical member, the light diffusion unit located on a side opposite to the light emitting unit with the optical member interposed between the light diffusion unit and the light emitting unit.

16. The camera flash according to claim 9, wherein:
the light emitting device further comprises an irradiation side light distribution member located on a side opposite to the light emitting unit with the optical member interposed between the irradiation side light distribution member and the light emitting unit, the irradiation side light distribution member being configured to define a distribution of light transmitted or passed through the optical member.

* * * * *